United States Patent
Asai et al.

(10) Patent No.: US 6,248,428 B1
(45) Date of Patent: Jun. 19, 2001

(54) ADHESIVE FOR ELECTROLESS PLATING, RAW MATERIAL COMPOSITION FOR PREPARING ADHESIVE FOR ELECTROLESS PLATING AND PRINTED WIRING BOARD

(75) Inventors: Motoo Asai; Yoshitaka Ono; Masato Kawade; Kouta Noda; Youko Nishiwaki, all of Ibi-gun (JP)

(73) Assignee: Ibiden Co., Ltd., Gifu (JP)

( * ) Notice: Subject to any disclaimer, the term of this patent is extended or adjusted under 35 U.S.C. 154(b) by 0 days.

(21) Appl. No.: 09/402,477

(22) PCT Filed: Apr. 15, 1998

(86) PCT No.: PCT/JP98/01724

§ 371 Date: Oct. 12, 1999

§ 102(e) Date: Oct. 12, 1999

(87) PCT Pub. No.: WO98/47328

PCT Pub. Date: Oct. 22, 1998

(30) Foreign Application Priority Data

Apr. 15, 1997 (JP) ............................................. 9-97735
Jun. 12, 1997 (JP) ........................................... 9-155201
Dec. 5, 1997 (JP) ............................................ 9-335466

(51) Int. Cl.7 ........................................................ B32B 3/00
(52) U.S. Cl. ........................ 428/206; 428/209; 428/344; 428/901; 174/259
(58) Field of Search ............................... 428/209, 206, 428/344, 901; 174/259

(56) References Cited

U.S. PATENT DOCUMENTS

| | | | |
|---|---|---|---|
| 4,752,499 | 6/1988 | Enomoto | 427/98 |
| 5,021,472 | 6/1991 | Enomoto | 523/427 |
| 5,055,321 | 10/1991 | Enomoto et al. | 427/98 |
| 5,344,893 | 9/1994 | Asai et al. | 525/398 |
| 5,447,996 | 9/1995 | Asai et al. | 525/398 |
| 5,519,177 | 5/1996 | Wang et al. | 174/259 |
| 5,589,255 | * 12/1996 | Enomoto et al. | 428/261 |
| 5,688,583 | 11/1997 | Asai et al. | 428/200 |
| 5,741,575 | 4/1998 | Asai et al. | 428/209 |
| 5,795,618 | 8/1998 | Asai et al. | 427/98 |
| 5,921,472 | 7/1999 | Haruch | 239/432 |
| 6,010,768 | * 1/2000 | Yasue et al. | 428/209 |

FOREIGN PATENT DOCUMENTS

| | | |
|---|---|---|
| 0625537 | 11/1994 | (EP) . |
| 61-276875 | 12/1986 | (JP) . |
| 63-12697 | 5/1988 | (JP) . |
| 63-158156 | 7/1988 | (JP) . |
| 2-8283 | 1/1990 | (JP) . |
| 2-188992 | 7/1990 | (JP) . |
| 4-055555 | 9/1992 | (JP) . |
| 5-03388 | 1/1993 | (JP) . |
| 6-283860 | 10/1994 | (JP) . |
| 7-034048 | 2/1995 | (JP) . |
| 10-4261 | 1/1998 | (JP) . |
| 10-4262 | 1/1998 | (JP) . |
| 98/47329 | 10/1998 | (WO) . |

OTHER PUBLICATIONS

English language abstract of JP 4–55555.
English language abstract of JP 63–158156.
English language abstract of JP 2–188992.

(List continued on next page.)

Primary Examiner—Cathy Lam
(74) Attorney, Agent, or Firm—Greenblum & Bernstein, P.L.C.

(57) ABSTRACT

Adhesive adhesive for electroless plating ensures insulation reliabilities between lines and between layers while maintaining a practical peel strength, and a printed circuit board using the adhesive are disclosed. The adhesive is formed by dispersing cured heat-resistant resin particles soluble in acid or oxidizing agent into uncured heat-resistant resin matrix hardly soluble in acid or oxidizing agent through curing treatment, in which the heat-resistant resin particles have an average particle size of not more than 2 μm, and comprised of rough particles and fine particles.

39 Claims, 11 Drawing Sheets

OTHER PUBLICATIONS

English language abstract of JP 61–276875.
English language abstract of JP 7–34048.
English language abstract of JP 10–4262.
English language abstract of JP 2–8283.
English language abstract of JP 6–283860.
English language abstract of JP 10–4261.
English language abstract of JP 63–12697.
English language abstract of JP 5–3388.

* cited by examiner (a)

(b)

ADHESIVE FOR ELECTROLESS PLATING, RAW MATERIAL COMPOSITION FOR PREPARING ADHESIVE FOR ELECTROLESS PLATING AND PRINTED WIRING BOARD

TECHNICAL FIELD OF THE INVENTION

This invention relates to an adhesive for electroless plating, material composition for preparing the adhesive and a printed circuit board, and more particularly to an adhesive for electroless plating suitable for the formation of fine pattern capable of ensuring an insulation reliability between lines while maintaining a practical peel strength in a semi-additive process or guaranteeing an insulation reliability between lines even at high temperature and high humidity conditions while maintaining a practical peel strength in a full-additive process, material composites for preparing the adhesive and a printed circuit board using the adhesive.

BACKGROUND ART

Recently, so-called build-up multilayer circuit boards have addressed from a demand for high densification of multilayer circuit boards. This build-up multilayer circuit board is produced by a method as described, for example, in JP-B-4-55555. That is, an interlaminar insulating resin agent composed of a photosensitive adhesive for electroless plating is applied onto a core substrate, dried, exposed to a light and developed to form an interlaminar insulating resin layer having openings for viaholes, and then the surface of the interlaminar insulating resin layer is roughened by treating with an oxidizing agent or the like, and a plating resist is formed on the roughened surface by subjecting a photosensitive resin layer to light exposure and development treatments, and thereafter a non-forming portion of the plating resist is subjected to an electroless plating to form a conductor circuit pattern inclusive of viaholes. Such steps are repeated plural times to obtain a multilayered build-up circuit board through an additive process.

In the build-up circuit board produced by such a method, the adhesive for electroless plating is obtained by dispersing soluble cured resin particles consisting of rough particles having an average particle size of 2–10 $\mu$m and fine particles having an average particle size of not more than 2 $\mu$m into a heat-resistant resin matrix hardly soluble through a curing treatment as disclosed in JP-A-63-158156 and JP-A-2-188992 (U.S. Pat. No. 5,055,321, U.S. Pat. No. 5,519,177) is used in the interlaminar insulating resin layer.

Furthermore, JP-A-61-276875 (U.S. Pat. No. 4,752,499, U.S. Pat. No. 5,021,472) discloses an adhesive for electroless plating obtained by dispersing soluble cured epoxy resin powder ground into an average particle size of 1.6 $\mu$m in a hardly soluble heat-resistant resin matrix.

The interlaminar insulating resin layer formed on the substrate using the above adhesive is roughened on its surface by dissolving and removing the heat-resistant resin particles in the surface layer and is excellent in adhesion to a conductor circuit formed on the roughened surface through the plating resist.

However, the build-up circuit board retaining the plating resist as a permanent resist such as the circuit board produced by the full-additive process is bad in adhesion at the boundary between the permanent resist and the conductor circuit. Therefore, this build-up circuit board has a problem that when an IC chip is mounted on the board, cracks are generated in the interlaminar insulating resin layer starting from a boundary between the plating resist and the conductor circuit resulting from a difference of thermal expansion coefficient.

On the contrary, a method of removing a plating resist and subjecting at least a side face of a conductor circuit to a roughening treatment to improve adhesion to an interlaminar insulating resin layer formed on the conductor circuit has hitherto been proposed as a technique capable of reducing cracks created on the interlaminar insulating resin layer. As a method of producing a circuit board advantageously utilizing this method, mention may be made of the semi-additive process.

In the semi-additive process, the surface of the interlaminar insulating resin layer is first roughened and an electroless plated film is thinly formed over a full roughened surface and then a plating resist is formed on a non-conductor portion of the electroless plated film and further an electrolytic plated film is thickly formed on a no-resist forming portion and thereafter the plating resist and the electroless plated film located below the plating resist are removed to form a conductor circuit pattern.

However, the build-up circuit board produced through the semi-additive process using the above adhesive has a problem that the electroless plated film remains in a depression (anchor) of the roughened surface of the adhesive layer located under the resist lowering the insulation reliability between the lines.

The also, the build-up circuit board produced through the full-additive process using the above adhesive has a problem that the value of insulation resistance between the conductor circuits lowers under high temperature and high humidity conditions.

Moreover, the circuit boards produced through the full-additive process and semi-additive process have a problem that the interlaminar insulation is broken if the adhesive contains relatively large heat-resistant resin particles having an average particle size of not less than 2 $\mu$m.

On the other hand, the above-mentioned adhesive for electroless plating, in case the printed circuit boards are industrially mass produced, require preservation from the beginning of manufacture up to the actual process of coating on the substrate.

For this reason, the adhesive for electroless plating has drawbacks including that a curing gradually proceeds or viscosity becomes high due to gelation during preservation.

SUMMARY OF THE INVENTION

The present invention proposes a technique for solving problems inherent to the circuit board produced through the above full-additive process or semi-additive process. It is a main object of the invention to provide an adhesive for electroless plating which is advantageous to ensure insulation reliabilities between lines and between layers while maintaining a practical peel strength. It is another object of the invention to provide a printed circuit board having excellent reliability by using the above adhesive for electroless plating.

It is another object of the present invention to provide an adhesive for the electroless plating which is capable of suppressing the curing of the adhesive which is generated inevitably in the course of preservation, and to provide a method of manufacturing the printed circuit board using thus obtained adhesive for the electroless plating.

The inventor has made various studies in order to achieve the above objects and considered that the occurrence of the above problems results from the fact that the average particle size of heat-resistant resin particles to be dissolved and removed has been too large and found the following knowledge.

That is, the interlaminar insulating resin layer consisting of the above adhesive obtained by dispersing soluble resin particles comprised of rough particles having an average particle size of 2–10 μm and fine particles having an average particle size of not more than 2 μm has a depression in a roughened surface formed on the surface of this layer, and the depth of the depression is about 10 μm (e.g. Example 1 of JP-A-7-34048 (U.S. Pat. No. 5,519,177)). Therefore, it is considered that since the electroless plated film is formed in the depth portion of the depression through the semi-additive process, it can not be removed completely and is retained to degrade the insulating property between lines. On the other hand, in the full-additive process, the surface area becomes large as the depression on the roughened surface becomes deep, and a great amount of palladium being a catalyst nucleus of the electroless plated film is present beneath the plating resist between lines. As a result, it is believed that the palladium reacts with chlorine ion or the like in the heat-resistant resin under conditions of high temperature and high humidity to form a conductive compound to thereby lower the insulating property between lines.

When the heat-resistant resin particles having an average particle size of not less than 2 μm are existent in the interlaminar insulating resin layer, gaps are apt to be created by the roughening treatment, so that the plated film is precipitated into the gaps to electrically connect the upper layer conductor circuit to the lower layer conductor circuit to thereby break the interlaminar insulation.

Based on the above knowledge, the inventors developed the adhesive for electroless plating having the following features.

The adhesive for electroless plating according to the invention is formed by dispersing cured heat-resistant resin particles soluble in acid or oxidizing agent into uncured heat-resistant resin matrix hardly soluble in acid or oxidizing agent through curing treatment, characterized in that the heat-resistant resin particles have an average particle size of less than 2 μm and are comprised of fine particles and rough particles.

Here, it is preferable that the heat-resistant resin particles are comprised of a mixture of heat-resistant rough particles having an average particle size of more than 0.8 μm but less than 2.0 μm and heat-resistant fine particles having an average particle size of 0.1–0.8 μm.

Further, the printed circuit board according to the present invention is characterized by having the following technical structures.

In a printed circuit board comprising a substrate, a cured adhesive layer for electroless plating having a roughened surface, and a conductor circuit formed on the roughened surface of the adhesive layer, said circuit is characterized by the adhesive layer for electroless plating formed by dispersing cured heat-resistant resin particles soluble in acid or oxidizing agent into uncured heat-resistant resin matrix hardly soluble in acid or oxidizing agent through curing treatment, and the heat-resistant resin particles having an average particle size of less than 2 μm, and comprising fine particles and rough particles.

Here, it is preferable that the heat-resistant resin particles are comprised of a mixture of heat-resistant rough particles having an average particle size of more than 0.8 μm but less than 2.0 μm and heat-resistant fine particles having an average particle size of 0.1–0.8 μm.

It is preferable that the depth of the depression of the roughened surface formed by dissolving and removing the heat-resistant resin particles is approximately Rmax=1–5 μm.

The conductor circuit formed on the roughened surface of the adhesive layer is preferably composed of an electroless plated film and an electrolytic plated film, and at least a part of the conductor circuit is preferably formed in a roughened layer.

It is preferable that a conductor circuit having a roughened surface formed on at least a part thereof is formed on the surface of the substrate.

Furthermore, a material composition for preparing the adhesive for the electroless plating, according to the present invention, which is capable of suppressing the curing of the adhesive which inevitably occurs in the course of preservation, is comprised of resin composition groups 1–3, each group prepared in advance for mixture, and kept or preserved in a separated manner to one another;

group 1: a resin composition comprising an uncured thermosetting resin which becomes hardly soluble in acid or oxidizing agent through curing treatment, group 2: a resin composition comprising cured heat-resistant resin particles soluble in an acid or oxidizing agent, a thermoplastic resin, and an organic solvent, and group 3: a curing agent composition.

Here, a weight ratio between the thermosetting resin of the group 1 and the thermoplastic resin of the group 2 is preferably to be 1/4~4/1.

BEST MODE FOR CARRYING OUT THE INVENTION

Figure 1:
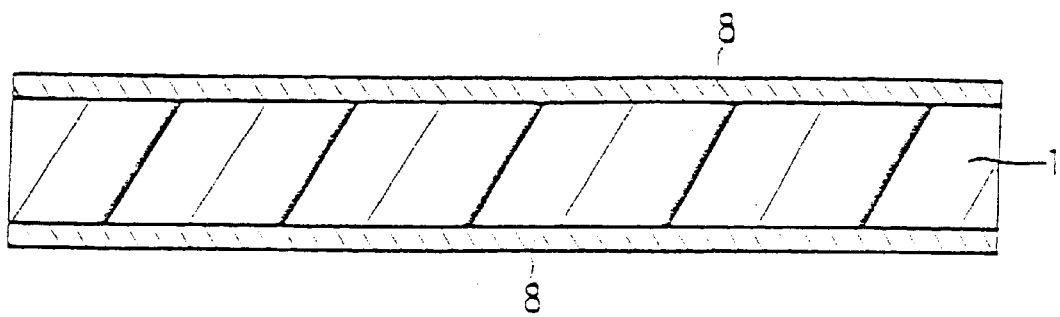
FIGS. 1–20 are diagrammatic views illustrating steps in the production of the multilayer printed circuit board a through semi-additive process using the adhesive for electroless plating according to the invention.

In case of the semi-additive process, it is necessary to dissolve and remove the electroless plated film beneath the plating resist as previously mentioned. Therefore, if the depression of the roughened surface is deep, the electroless plated film is apt to be left in the depression, which results in the lowering of the insulation resistance value between lines. On the other hand, if the depression has a simple shape and is shallow, the peel strength of the plated film lowers and the conductor is apt to be peeled off.

In case of the full-additive process, the palladium catalyst remains beneath the plating resist as previously mentioned, so that if the depression of the roughened surface is deep, insulation resistance value between lines lowers under conditions of high temperature and high humidity. On the other hand, if the depression has a simple shape and is shallow, the peel strength of the plated film lowers and the conductor is apt to be peeled off likewise the case of the semi-additive process.

In this connection, the adhesive for electroless plating according to the invention is characterized by including the heat-resistant resin particles having an average particle size of less than 2.0 µm, and are comprised of fine particles and rough particles. This presents the depression of the roughened from becoming surface deep due to the dissolution of the resin particles having a large particle size (i.e. the depression of the roughened surface is made shallow) and hence the dissolved residue of the electroless plated film in the depression is removed or the amount of the palladium catalyst beneath the plating resist is decreased, so that the insulation reliability between lines and between layers can be ensured while maintaining the practical peel strength even in the roughened surface having shallow depressions.

In the adhesive for electroless plating according to the invention, the heat-resistant resin particles are of less than 2.0 µm in the average particle size so that the depth of the depression formed by removal and dissolution is shallow, and there is caused no gap even when the roughening too proceeds.

Therefore, the printed circuit board produced by using the adhesive containing such heat-resistant resin particles is excellent in the insulating property between layers.

In the invention, the resulting depression is shallow, so that even when adopting either semi-additive process or full additive process, there can be formed a fine pattern having a ratio of line/space (hereinafter referred to as L/S simply)= less than 40/40 µm.

The above-mentioned heat-resistant resin particles may be dissolved and removed from the cured adhesive layer through roughing treatment to form depressions having complex shape because of the difference in an average particle size of the rough and fine particles. Thus, in the printed circuit board produced by using the adhesive containing the heat-resistant resin particles, the practical peel strength can be maintained even if the depression of the roughened surface is shallow.

For example, in case of the full-additive process, the photosensitive resin layer for the formation of the plating resist formed on the roughened surface is subjected to light exposure and development to form the plating resist. Therefore, if the depression of the roughened surface is deep, the developed residue of the plating resist is liable to be retained in the depression. In the invention, however, the depression to be formed is shallow and the resist in the depression can easily be developed, so that there is hardly any developed residue of the plating resist, and even if the depression is made shallow, the lowering of the peel strength is relatively small.

On the other hand, in case of the semi-additive process, there is a method of directly forming the electroless plated film on the roughened surface, so that the plating resist does not remain in the depression of the roughened surface, and even if the depression is made shallow, the lowering of the peel strength is relatively small.

Moreover, when the opening for the formation of the viahole is formed by light exposure and development, laser processing or the like, the adhesive for electroless plating remains as a residue in the bottom of the opening for the formation of the viahole. In the invention, the fine heat-resistant resin particles soluble in acid or oxidizing agent are existent in the adhesive for electroless plating, so that the above residue can easily be removed by the roughening treatment with acid or oxidizing agent and hence it is not necessary to form a layer for the removal of the residue beneath the adhesive layer.

The heat-resistant resin particles according to the invention, i.e. rough particles and fine particles, are favorably spherical particles instead of ground particles. Because when the heat-resistant resin particles are ground particles, the depression shape in the roughened surface is sharp and stress concentration is apt to be caused in the sharpened corner and cracks are liable to be created from the corner through heat cycle.

The heat-resistant resin particles are favorably comprised of a mixture of heat-resistant rough particles having an average particle size of more than 0.8 µm but less than 2.0 µm and heat-resistant fine particles having an average particle size of 0.1–0.8 µm. With such structure of the resin particles, the depth of the depression formed by dissolving and removing the heat-resistant resin particles is approximately Rmax=about 3 µm. As a result, in the semi-additive process, the electroless plated film on the non-conductor portion can easily be removed by etching and also the Pd catalyst nucleus existing beneath the electroless plated film can easily be removed, while the peel strength of the conductor portion can be maintained at a practical level of 1.0–1.3 kg/cm. On the other hand, in the full-additive process, the amount of Pd catalyst nucleus beneath the plating resist can be decreased and also the plating resist residue on the conductor portion can be removed, so that even if the depression is shallow, the peel strength can be maintained at a practical level of 1.0–1.3 kg/cm.

In the heat-resistant particles, a mixing ratio of heat-resistant resin rough particles to heat-resistant resin fine particles is favorably 35/10–10/10 as a weight ratio. If the rough particles are too large, the depression of the roughened surface is too deep and it is difficult to remove the electroless plated film on the non-conductor portion by etching, while if the rough particles are too small, the depression of the roughened surface is too shallow and adhesion to conductor(plated film) is poor and a favorable strength is not obtained.

Moreover, the rough particles are 10–40% by weight to a solid content in the adhesive for electroless plating. On the other hand, the fine particles are 1–15% by weight to a solid content in the adhesive for electroless plating.

Further, the weight of the rough particles is adjusted to be equal to or more than the weight of the fine particles within a range of the above weight percentage.

In the adhesive for electroless plating according to the invention, it is necessary that the heat-resistant resin particles are previously subjected to a curing treatment. If the particles are not cured, they are dissolved in a solvent dissolving the resin matrix and uniformly mixed with the matrix and hence the heat-resistant resin particles can not selectively be dissolved and removed with acid or oxidizing agent.

In the adhesive for electroless plating according to the invention, thermosetting resins (including a case of photosensitizing a part or whole of thermosetting group) and a composite of thermosetting resin (including a case of photosensitizing a part or whole of thermosetting group) and thermoplastic resin can be used as the heat-resistant resin matrix.

As the thermosetting resin, use may be made of epoxy resin, phenolic resin, polyimide resin and the like. As the epoxy resin, use may be made of novolac-type epoxy resin, alicyclic epoxy resin and the like.

It is desirable that in the thermosetting resin a part of the thermosetting functional group is replaced with photosensitive group to impart photosensitivity. This is because if the interlaminar insulating layer is formed by using such adhesive agent that contains as a resin component the thermosetting resin with photosensitivity, the openings for the viaholes may easily be formed in the adhesive layer by the light exposure and development treatment.

Moreover, if a part or whole of the thermosetting group is photosensitized, it is acrylated by reacting with methacrylic acid, acrylic acid or the like. Particularly, an acrylated epoxy resin is optimum.

As the thermoplastic resin, use may be made of polyether sulphone, polysulphone, polyphenylene sulphone, polyphenylene sulfide, polyphenyl ether, polyether imide and the like.

It is preferable that the thermoplastic resin is less than 30% by weight to a solid content in the resin matrix, more preferably 10–25% by weight to the solid content in the resin matrix. If it is not less than 30% by weight to the solid content in the resin matrix, the thermoplastic resin remains at the bottom of the opening for the formation of the viahole, resulting in the peeling off between the viaholes and inner conductor circuits due to bad continuity and heating test.

In the adhesive for electroless plating according to the invention, amino resin (such as melamine resin, urea resin, guanamine resin or the like), epoxy resin, bismaleimide-triazine resin and the like can be used as a material for the heat-resistant resin particles.

Moreover, the epoxy resins can optionally be prepared to ones soluble in acid or oxidizing agent and ones hardly soluble therein by properly selecting the kind of oligomer, kind of curing agent and the like. For example, resin obtained by curing bisphenol A-type epoxy oligomer with an amine curing agent is easily soluble in chromic acid, while resin obtained by curing cresol novolac type epoxy oligomer with an imidazole curing agent is hardly soluble in chromic acid.

Furthermore, the adhesive for electroless plating according to the invention may be rendered into B-stage by impregnating in a fibrous substrate such as glass cloth or the like, or may be shaped into a film. Further, it may be shaped into a substrate. Moreover, the adhesive for electroless plating according to the invention may be flame-retarded by halogenating the constitutional resin, or may be added with coloring matter, pigment and ultraviolet ray absorbing agent. And also, the toughness and thermal expansion coefficient may be adjusted by filling with fibrous filler or inorganic filler.

The printed circuit board using the adhesive for electroless plating according to the invention is a printed circuit board comprising a substrate, a cured adhesive layer for electroless plating having a roughened surface, and a conductor circuit formed on the roughened surface of the adhesive layer, this adhesive layer is composed of an adhesive for electroless plating formed by dispersing cured heat-resistant resin particles soluble in acid or oxidizing agent into uncured heat-resistant resin matrix hardly soluble in acid or oxidizing agent through curing treatment, characterized in that the heat-resistant resin particles have an average particle size of less than 2.0 $\mu$m, and comprised of a mixture of heat-resistant rough particles having an average particle size of less than 2.0 $\mu$m and heat-resistant fine particles having an average particle size of less than 2.0 $\mu$m.

In the printed circuit board according to the invention, the roughened surface of the adhesive layer is favorable to have a depression depth of Rmax=1–5 $\mu$m. This depression depth is about half of a depression depth Rmax=10 $\mu$m in the roughened surface formed by the conventional adhesive, and which avoids leaving the plated film even if the electroless plated film is dissolved and removed beneath the plating resist and is capable of decreasing the amount of the palladium catalyst nucleus beneath the plating resist.

Furthermore, it is preferable that the roughened surface has depression depth of 1–5$\mu$m and the count value of the peak (Pc) of the roughness per a 2.5 mm length of the surface, where $0.01 \leq Pc \leq 0.1$ $\mu$m is 10–2500, the count value where $0.1 \leq Pc \leq 1.0$ $\mu$m is 100–1000, respectively. With such decreased number of minute depressions, the plating resist is prevented from remaining on the roughened surface in the full-additive process, and the electroless plating film and Pd catalyst are prevented from remaining on the roughened surface. It has been found that the peel strength is not reduced with the decreased number of the minute depressions.

The number of the minute depressions are counted or measured by means of the atomic force microscope(AFM by Olympus Optical Co., Ltd.) in the AC mode operation (resonance) after 10 minutes Blower-type static electricity removal operation.

Japanese unexamined patent publication No.10-4262 discloses such roughened surface with which conductor circuitry is in contact. With respect to such roughened surface, the count value of the peak (Pc) of the roughness per a 2.5 mm length of the surface, where $0.01 \leq Pc \leq 0.1$ $\mu$m is 12000 or greater, and the count value of the peak(Pc) where $0.1 \leq Pc \leq 1.0$ $\mu$m is 25000 or greater, respectively. The number of the minute depression is excessive, and the plating resist, electroles plating film and Pd catalyst remains in the roughened surface, resulting in the peel strength not being improved.

In the printed circuit board according to the present invention, the thickness of the adhesive layer for electroless plating is less than 50 $\mu$m, and preferably 15–45 $\mu$m. If the thickness of an adhesive layer is less than 50 $\mu$m, the heat-resistant resin particles in the layer are apt to be associated to one another, causing breakage of interlaminar insulation. In this connection, the particle size of the heat-resistant resin particles is selected to be enough small not to cause the breakage of interlaminar insulation.

It is desirable that the viaholes each having an diameter of less than 100 $\mu$m are formed in the adhesive layer for electroless plating. If the viaholes with small diameter are formed in the adhesive layer, the developed residue is reliable retained. In this connection, the adhesive layer according to the present invention, comprises the heat-resistant fine resin particles, thereby the developed residue may easily be removed. Further, if the viaholes with small diameter are formed and the adhesive contains larger-size particles, the diameter of viaholes becomes large in the roughening treatment. In this connection also, it is advantageous to employ the adhesive having heat-resistant minute or fine resin particles.

In the printed circuit board according to the invention, the conductor circuit formed on the roughened surface of the adhesive layer is preferably has comprised of thin electroless plated film and thick electrolytic plated film in the semi-additive process. Since the electrolytic plated film showing a small plating stress is thickened, even if the depression of the roughened surface is shallow, there is no peeling of the plated film.

In the printed circuit board according to the invention, the conductor circuit may be formed on the surface of the substrate on which the adhesive for electroless plating is provided. In this case, the conductor circuit preferably has a roughened layer on at least a part of the surface thereof. For example, it is desirable that when the substrate is formed through the full-additive process, the roughening layer is formed on an upper surface of the conductor circuit, or when the substrate is formed through the semi-additive process, the roughened layer is formed on a aide surface or full surface of the conductor circuit. Because the adhesion property of the adhesive layer for electroless plating is improved by these roughening layers and hence the occurrence of cracks resulting from the difference in thermal expansion coefficient between the conductor circuit and the adhesive for electroless plating in the heat cycle can be controlled.

Further, it is desirable that a roughened layer is formed on at least a part of the surface of the conductor circuit formed on the roughened surface of the adhesive layer, i.e. an upper surface, side surface or full surface thereof. Thereby, adhesion to a solder resist covering the conductor circuit or an upper interlaminar insulating resin layer can be improved to control the occurrence of cracks in the heat cycle.

The formation of such roughened surface will likely cause the resin to remain in the roughened layer when the openings for the formation of viaholes are formed in the upper interlaminar insulating resin layer. In this connection, according to the adhesive for electroless plating comprising fine particles having an average particle size of not more than 2 μm as heat-resistant resin particles soluble in an acid or oxidizing agent, the resin residue will easily be dissolved and removed by the acid or oxidation treatment, since such fine particles are present in the resin residue in the roughened surface.

The roughness of the roughened surface is desirable to be 0.1 μm~10 μm, because this range of roughness provides best adhesion property.

It is desirable that the roughness of the roughened surface is 0.1~10 μm and the count value of the peak (Pc) of the roughness at a surface length of 2.5 mm where $0.01 \leq Pc \leq 0.1$ μm is 100~1000, the count value where $0.1 \leq Pc \leq 1.0$ μm is 100~2000, respectively. With such comparatively decreased number of minute depressions, the resin residue in the roughened surface appearing when the openings for the formation of viaholes are formed can be reduced.

Further, with such decreased number of minute depressions that do not improve the peel strength, high frequency signal is prevented from being delayed in propagation along the conductor circuit, since the high frequency signal travels on a surface of the conductor layer.

The Japanese unexamined patent publication No. 10-4261 discloses such roughened surface with which conductor circuitry is in contact that the count value of the peak (Pc) of the roughness per a 2.5 mm length of the surface, where $0.01 \leq Pc \leq 0.1$ μm is 30000 or greater, and the count value of the peak(Pc) where $0.1 \leq Pc \leq 1.0$ μm is 3000–10000, respectively, however, the number of the minute depression is excessive, and the resin residue can remarkably be seen.

The number of the minute depressions was counted or measured by means of the atomic force microscope(AFM by Olympus Optical Co.,Ltd.) in the AC mode operation (resonance) after 10 minutes Blower-type static electricity removal operation.

Next, the material composition for preparing the above-mentioned adhesive for electroless plating will be explained.

The material composition is comprised of resin composition groups 1–3, each group prepared in advance for mixture, and kept or preserved in a separated manner to one another;

group 1: a resin composition comprising an uncured thermosetting resin which becomes hardly soluble in the acid or oxidizing agent through curing treatment,
group 2: a resin composition comprising cured heat-resistant resin particles soluble in an acid or oxidizing agent, a thermoplastic resin, and an organic solvent, and
group 3: a curing agent composition.

With each resin composition of each group being kept or preserved in a separated manner to one another, the curing of the resin component of each composition does not proceed, and there can be seen no viscosity increasing. If the resin compositions of group 1 and 2 are mixed together and left for a long time, the mixture gels and the viscosity increases despite of the absence of the curing agent. In this connection, such gelation does not occur because the composition of each group is preserved in a separated manner to one another.

Further, according to the present invention, the photopolymerization reaction of the resin component does not proceed even in the case of the resin component exposed to light. As a result, no degradation can be seen in the resolving degree when the adhesive for electroless plating comprising such material composition is applied on the substrate and exposed to light in the manufacturing process of the printed circuit board.

In the material composition of the present invention, it is favorable that the heat-resistant resin particles have an average particle size of less than 2 μm and comprised of rough particles and fine particles, that is to say, comprised of a mixture of the heat-resistant rough particles having an average particle size of more than 0.8 μm but less than 2.0 μm and the heat-resistant fine particles having an average particle size of 0.1–0.8 μm.

The mixing ratio of the heat-resistant resin rough particles to heat-resistant resin fine particles is desirably to be 35/10~10/10 as a weight ratio.

Further, it is desirable that the rough particles are 40–80 parts by weight to the 100 parts by weight of the thermoplastic resin of the group 2, and the fine particles are 10–40 parts by weight to the 100 parts by weight of the thermoplastic resin of the group 2.

Furthermore, a mixing ratio of the thermosetting resin in the group 1 to the thermoplastic resin in the group 2 is desirably to be 1/4~4/1 as a weight ratio. This is because such range of the mixing ratio can provide an improved toughness of the thermosetting resin.

The organic solvent in the group 2 is desirably to be 100–300 parts by weight to the 100 parts of the thermoplastic resin.

The curing agent in the group 3 is desirably to be 1–10% by weight to a total solid content of the adhesive for electroless plating.

As the curing agent, it is desirable to use such a type of curing agent that is liquid at 25° C., i.e. liquid imidazole curing agent such as 1-benzyl-2-ethylimidazole (1B2MZ), 1-cyanoethyl-2-4-methylimidazole (2E4MZ-CN), or 4-methyl-2-ethylimidazole(2E4MZ).

As the organic solvent, it is desirable to use glycolic ether type solvents such as diethylene glycol dimethyl ether (DMDG), and triethylene glycol dimethyl ether(DMTG), having the below structural formula, or normal methyl pyrrolidone(NMP).

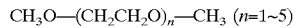

$CH_3O-(CH_2CH_2O)_n-CH_3$ (n=1~5)

A photosensitive monomer and/or antiforming agent may be added to the composition of the group 1. As the photosensitive monomer, Aronix M325, M315 (by Toa Gosei Co., Ltd.),DPE-6A(by Nippon Kayaku Co., Ltd.), or R-604 (by Kyoeisha Kagaku Co., Ltd) may be used. As the antiforming agent, silicon type antiforming agent or S-65 (by Sannopco Co., Ltd.) may be used.

It is desirable that the composition of the group 3 contains a curing agent of the thermosetting resin and photoinitiator, ensuring the exposure and development treatment of the adhesive and curing of the adhesive by heating treatment. Further, photoinitiator and photosensitizer may be added to the composition of the group 3.

As the photoinitiator, Irgaquar 907 made by Ciba Geigy or benzophenone may be used, and as the photosensitizer, DETX-S made by Nippon kayaku Co., Ltd. or Michler's ketone may be used.

A method of producing the printed circuit board according to the invention through semi-additive or full-additive process will concretely be described below.

[Semi-additive process]

(1) In order to produce a multilayer circuit board through the semi-additive process, a circuit substrate is first prepared by forming a conductor circuit on a surface of a substrate.

As the substrate, use may be made of insulating resin substrates such as glass epoxy substrate, polyimide substrate, bismaleimide-triazine substrate and the like, ceramic substrate, metal substrate and so on.

The conductor circuit in the wiring substrate is formed by a method of etching a copper-clad laminate, or a method of forming an adhesive layer for electroless plating on a substrate such as glass epoxy substrate, polyimide substrate, ceramic substrate, metal substrate or the like and roughening the surface of the adhesive layer and subjecting the roughened surface to an electroless plating, or so-called semi-additive process (the whole of the roughened surface is subjected to a thin electroless plating to form a plating resist and a portion not forming the plating resist is subjected to thick electrolytic plating and the plating resist is removed and etched to form a conductor circuit comprised of the electrolytic plated film and electroless plated film).

Moreover, the conductor circuit in the wiring substrate can improve the adhesion property to the interlaminar insulating resin layer to be formed on the conductor circuit by forming a roughened layer consisting of copper-nickel-phosphorus on the surface inclusive of at least a side surface.

The roughened layer is desirable to be formed by the electroless plating. The composition of the electroless plating solution is desirable to have a copper ion concentration of $2.2 \times 10^{-2}$–$4.1 \times 10^{-2}$ mol/l, a nickel ion concentration of $2.2 \times 10^{-3}$–$4.1 \times 10^{-3}$ mol/l and a hypophosphorous acid ion concentration of 0.20–0.25 mol/l, respectively. The film precipitated within the above range is needle in the crystal structure and is excellent in the anchor effect. Moreover, a complexing agent and additives may be added to the electroless plating bath in addition to the above compounds.

As the other method of forming the roughening layer, there is a method of subjecting the surface of the conductor circuit to oxidation (graphitization)-reduction, etching treatment or the like.

The roughened layer may be covered with a layer of metal or noble metal having an ionization tendency of more than copper but less than titanium. Such a metal or noble metal layer covering the roughened layer can prevent the dissolution of the conductor circuit due to a local electrode reaction created in the roughening of the interlaminar insulating resin layer. The thickness of this layer is 0.1–2.0 $\mu$m.

As the metal, there is at least one metal selected from titanium, aluminum, zinc, iron, indium, thallium, cobalt, nickel, tin, lead, bismuth and the like. As the noble metal, there are gold, silver, platinum and palladium. Among them, tin is preferable. Tin can form a thin layer through electroless substitution plating and can advantageously be followed to the roughened layer. In case of tin, a solution of tin borofluoride-thiourea or tin chloride-thiourea is used. In this case, a tin (Sn) layer having a thickness of 0.1–2.0 $\mu$m is formed through Cu—Sn substitution reaction. In case of the noble metal, there are adopted sputtering method, vaporization method and the like.

In the core substrate are formed through-holes, and front wiring layer and back wiring layer are electrically connected to each other through the through-holes.

Further, a low viscosity resin such as bisphenol F-type epoxy resin or the like is filled in the through-hole and between the conductor circuits of the core substrate to ensure the smoothness of the wiring substrate.

(2) Then, an interlaminar insulating resin agent is applied to the wiring substrate prepared in the step (1).

As the interlaminar insulating resin agent; and the adhesive for electroless plating according to the invention is used. In this case, roll coater, curtain coater and the like can be used for the application of the interlaminar insulating resin agent.

Moreover, in case of plural interlaminar insulating resin layers, the particle size of the heat-resistant resin particles in each of the layers may be changed. For example, the heat-resistant resin particles of the underlayer have an average particle size of 1.0 $\mu$m, and the heat-resistant resin particles of the upperlayer are comprised of a mixture of particles having an average particle size of 1.0 $\mu$m and particles having an average particle size of 0.5 $\mu$m, whereby the adhesive for electroless plating may be constructed with heat-resistant resin particles having different particle sizes. Particularly, the heat-resistant resin particles of the underlayer have an average particle size of 0.1–2.0 $\mu$m, more preferably 0.1–1.0 $\mu$m.

Specifically, the material composition for the preparation of the adhesive for electroless plating according to the present invention may be mixed together just before applying and then applied as the adhesive for electroless plating.

Such adhesive for electroless plating is prepared by mixing the components of the material composition by means of roll kneading, ball mills or bees mills. For example, firstly, the components of the group 2 are mixed together and adjusted by means of roll kneading, ball mills or bees mills, and after mixing the components, the components of the group 1 and the curing agent of the group 3 are added to the mixture and mixed all together.

As the heat-resistant resin matrix constituting the adhesive layer of the underlayer, there can be used a thermosetting resin, a thermosetting resin (a part or whole of thermosetting group is photosensitized), or a composite of thermosetting resin (a part or while of thermosetting group is photosensitized) and a thermoplastic resin.

As the thermosetting resin constituting the adhesive layer of the underlayer, there can be used epoxy resin, phenolic resin, polyimide resin and the like. When a part of the thermosetting group is photosensitized, a part of the thermosetting group is acrylated by reacting with methacrylic acid, acrylic acid or the like. Among them, acrylated epoxy resin is optimum. As the epoxy resin, there can be used novolac type epoxy resin, alycyclic epoxy resin and the like.

As the thermoplastic resin constituting the adhesive layer of the underlayer, use may be made of polyether sulphone, polysulphone, polyphenylene sulphone, polyphenylene sulfide, polyphenyl ether, polyether imide and the like.

As the heat-resistant resin particle constituting the adhesive layer of the underlayer, use may be made of amino resin (melamine resin, urea resin, guanamine resin and the like), epoxy resin, bismaleimide-triazine resin and the like.

(3) The applied interlaminar insulating resin agent is dried.

At this time, the interlaminar insulating resin layer formed on the conductor circuit of the substrate frequently has a state of causing unevenness due to the fact that the thickness of the interlaminar insulating resin layer on the conductor circuit pattern is thin and the thickness of the interlaminar insulating resin layer on the conductor circuit having a large area is thick. Therefore, it is desirable that the surface of the interlaminar insulating resin layer is smoothened by pushing a metal plate or a metal roll onto the interlaminar insulating resin layer of the uneven state while heating.

(4) Next, an opening for the formation of viahole is formed in the interlaminar insulating resin layer while curing the interlaminar insulating resin layer.

The curing treatment of the interlaminar insulating resin layer is carried out by heat-curing when the resin matrix of the adhesive for electroless plating is a thermosetting resin, or by exposing to an ultraviolet ray or the like when it is a photosensitive resin.

The opening for the formation of viahole formed by using a laser beam or an oxygen plasma when the resin matrix of the adhesive for electroless plating is a thermosetting resin, or by light exposure and development when it is a photosensitive resin. Moreover, the light exposure and development are carried out after a photomask depicted with a circle pattern for the formation of the viahole (glass plate is favorable) is closely placed on the photosensitive interlaminar insulating resin layer so as to face the side of the circle pattern to the layer.

(5) The surface of the interlaminar insulating resin layer (adhesive for electroless plating) provided with the opening for the formation of the viahole is roughened.

In the invention, the surface of the adhesive layer is particularly subjected to a roughening treatment by dissolving and removing the heat-resistant resin particles existing in the surface area of the adhesive layer for electroless plating with acid or oxidizing agent. In this case, the depression depth of the roughened surface is favorably to be about 1–5 $\mu$m.

As the acid, there are phosphoric acid, hydrochloric acid, sulfuric acid and organic acids such as formic acid, acetic acid and the like. Particularly, the use of the organic acid is desirable because it hardly corrodes the metal conductor layer exposed from the viahole in the roughening treatment.

As the oxidizing agent, it is desirable to use chromic acid, or permanganate (potassium permanganate or the like).

(6) A catalyst nucleus is applied to the roughened surface of the interlaminar insulating resin layer.

In the application of the catalyst nucleus, it is desired to use a noble metal ion, a noble metal colloid or the like. In general, palladium chloride or palladium colloid is used. Moreover, it is desired to conduct a heating treatment for fixing the catalyst nucleus. As the catalyst nucleus, palladium is favorable.

(7) An electroless plated film is thinly formed on the full roughened surface of the interlaminar insulating resin layer.

As the electroless plated film, an electroless copper plated film is favorable and has a thickness of 1–5 $\mu$m, more particularly 2–3 $\mu$m. As the electroless copper plating solution, use may be made of any solution composition used in the usual manner. For example, a solution composition comprising copper sulfate: 29 g/l, sodium carbonate: 25 g/l, tartarate: 140 g/l, sodium hydroxide: 40 g/l, and 37% formaldehyde: 150 $\mu$ml (pH=11.5).

(8) A photosensitive resin film (dry film) is laminated on the electroless plated film formed in the step (7) and a photomask (glass substrate is favorable) depicted with a plating resist pattern is closely placed thereonto, which is subjected to a light exposure and development to form a non-conductor portion forming the plating resist pattern.

(9) An electrolytic plated film is formed on the electroless plated film other than the non-conductor portion to form conductor circuits and conductor portion as a viahole.

As the electrolytic plating, it is desirable to use an electrolytic copper plating, and the thickness thereof is favorably 10–20 $\mu$m.

(10) After the plating resist on the non-conductor portion is removed, the electroless plated film is removed by dissolving in an etching solution such as a mixture of sulfuric acid and hydrogen peroxide, sodium persulfate, ammonium persulfate, iron chloride, copper chloride or the like to obtain independent conductor circuits consisting of the electroless plated film and the electrolytic plated film and viaholes. Moreover, the palladium catalyst nucleus on the roughened surface exposed from the non-conductor portion is dissolved and removed by chromic acid or the like.

(11) A roughened layer is formed on the surface of the conductor circuit and viahole formed in the step (10).

As the method of forming the roughened layer, there are etching treatment, polishing treatment, redox treatment or plating treatment.

The redox treatment is conducted by using an oxidation bath (graphitization bath) of NaOH (10 g/l), NaClO$_2$ (40 g/l) and Na$_3$PO$_4$ (6 g/l) and a reduction bath of NaOH (10 g/l) and NaBH$_4$ (5 g/l).

Furthermore, when the roughened layer is made from copper-nickel-phosphorus alloy layer, it is precipitated by the electroless plating. As the electroless alloy plating solution, it is favorable to use a plating bath of solution composition comprising copper sulfate: 1–40 g/l, nickel sulfate: 0.1–6.0 g/l, citric acid: 10–20 g/l, hypophosphite: 10–100 g/l, boric acid: 10–40 g/l and surfactant: 0.01–10 g/l.

(12) An interlaminar insulating resin layer is formed on the substrate according to the steps (2), (3).

(13) If necessary, the formation of multilayer is carried out by repeating the steps (4)–(10) to produce a multilayer circuit board.

[Full-additive process]

(1) The aforementioned steps (1)–(6) are carried out by using the adhesive for electroless plating according to the invention likewise the semi-additive process.

(2) A non-conductor portion forming the plating resist pattern is formed on the roughened surface of the interlaminar insulating resin layer (adhesive layer for electroless plating) provided with the catalyst nucleus.

The plating resist is formed by laminating a commercially available photosensitive dry film and subjecting to light exposure and development, or by applying a liquid plating resist composition with a roll coater or the like, drying, and subjecting to light exposure and development.

As the plating resist composition, it is desirable to use a photosensitive resin composition comprising a resin obtained by acrylating a novolac type epoxy resin such as cresol novolac type epoxy resin, phenol novolac type epoxy resin or the like with methacrylic acid or acrylic acid and an imidazole curing agent. Because, such a photosensitive resin composition is excellent in the resolution and resistance to base.

(3) An electroless plating is carried out on portions other than the non-conductor portion (plating resist portion) to form conductor circuit and conductor portion as a viahole. As the electroless plating, an electroless copper plating is favorable.

Moreover, when the opening for the formation of the viahole is filled by electroless plating to form a so-called filled viahole, the surface of the conductor layer as an underlayer exposed from the opening for the formation of the viahole is first activated with acid before the catalyst nucleus is applied to the adhesive layer for electroless plating, which is immersed in an electroless plating solution. After the opening for the formation of viahole is filled by electroless plating, the catalyst nucleus is given to the adhesive layer for electroless plating and the plating resist is formed, which is subjected to an electroless plating to form a conductor layer.

The viahole formed by filling with the electroless plated film can form another viahole just thereabove, so that it is possible to make circuit board size small and a density thereof high.

As means for improving the adhesion force between the conductor layer and the adhesive layer for electroless plating, there is a method wherein an alloy plating using at least two metal ions selected from copper, nickel, cobalt and phosphorus is applied as a primary plating and thereafter copper plating is applied as a secondary plating. These alloys are high in strength and can improve peel strength.

(4) A roughened layer is formed on upper surfaces of the conductor circuit formed other than the plating resist portion and the viaholes.

As the method for the formation of the roughened layer, there are etching treatment, polishing treatment, redox treatment and plating treatment.

Moreover, the roughened layer comprised of copper-nickel-phosphorus alloy layer is formed by precipitation through electroless plating.

(5) If necessary, interlaminar insulating layer as an upper layer (adhesive layer for electroless plating) and conductor circuit are laminated to produce a multilayer circuit board.

EXAMPLE 1

Semi-additive Process (1) As a starting material, there is used a copper-clad laminate formed by laminating copper foils 8 of 18 $\mu$m onto both surfaces of a substrate 1 made from glass epoxy resin or BT (bismaleimide triazine) resin of 0.6 mm in thickness (see FIG. 1). At first, the copper-clad laminate is drilled and subjected to electroless plating and etched in a pattern to form innerlayer conductor circuits 4 and a through-hole 9 on both surfaces of the substrate 1.

Figure 3:
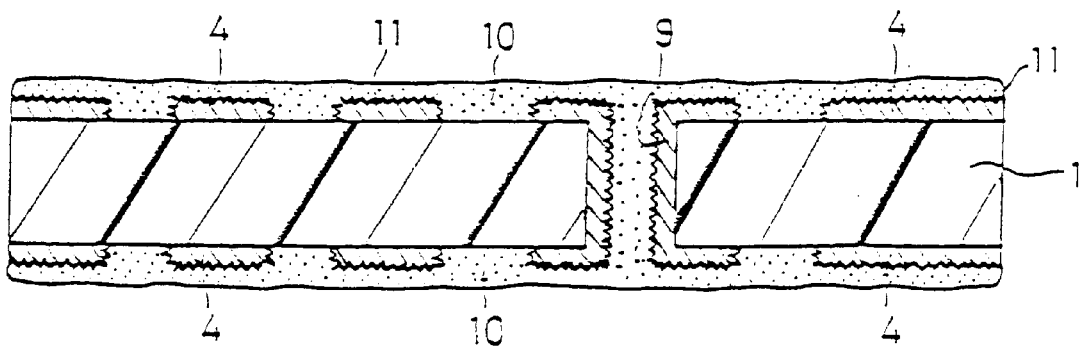
Figure 4:
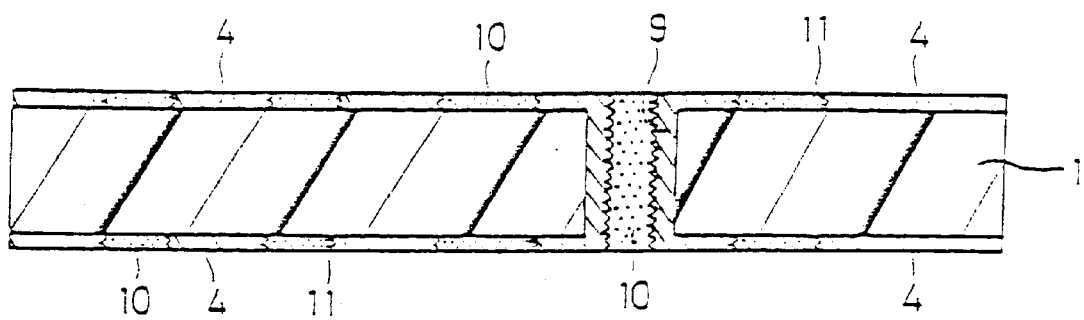

The surfaces of the innerlayer conductor circuits 4 and through-hole 9 are roughened by oxidation (graphitization)-reduction treatment (see FIG. 2), and bisphenol F-type epoxy resin as a filling resin 10 is filled between the conductor circuits and in the through-hole (see FIG. 3), and thereafter the surface of the substrate is smoothened by polishing so as to expose the surfaces of the conductor circuits and the land face of the through-hole (see FIG. 4).

(2) After the substrate subjected to the treatment of the step (1) is washed with water and dried, it is acidically degreased, soft-etched and treated with a catalyst solution of palladium chloride and organic acid to give a Pd catalyst. After the activation of the catalyst, it is subjected to a plating in an electroless plating bath containing 8 g/l of copper sulfate, 0.6 g/l of nickel sulfate, 15 g/l of citric acid, 29 g/l of sodium hypophosphite, 31 g/l of boric acid and 0.1 g/l of surfactant and having pH=9 to form a roughened layer 11 (uneven layer) of Cu—Ni—P alloy of 2.5 $\mu$m in thickness on the exposed surface of the copper conductor circuit.

Figure 5:
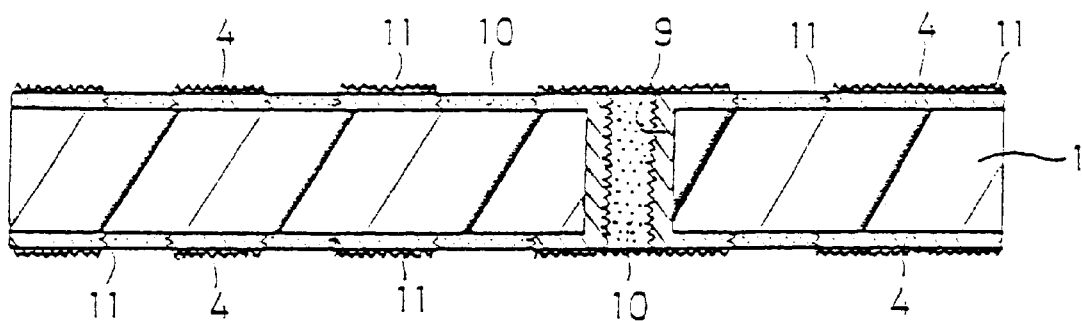

Further, the substrate is immersed in an electroless tin substitution plating bath containing 0.1 $\mu$mol/l of tin borofluoride and 1.0 $\mu$mol/l of thiourea at 50° C. for 1 hour to form a tin substitution plated layer of 0.3 $\mu$m in thickness on the surface of the roughened layer 11 (see FIG. 5, provided that the tin layer is not shown). A photosensitive adhesive solution for electroless plating (interlaminar insulating resin agent) is prepared by mixing 34 parts by weight of 25% acrylated product of cresol novolac type epoxy resin (made by Nippon Kayaku Co., Ltd.; molecular weight: 2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 4 parts by weight of caprolactone modified tris(acroxyethyl) isocyanurate (made by Toa Gosei Co., Ltd.; trade name: Aronix M315) as a photosensitive monomer, 2 parts by weight of a photoinitiator (made by Ciba Geigy; trade name: Irgaquar 907), 0.2 part by weight of a photosensitizer (made by Nippon Kayaku Co., Ltd.; trade name: DETX-S), 15 parts by weight of epoxy resin particles having an average particle size of 1.0 $\mu$m and 10 parts by weight of epoxy resin particles having an average particle size of 0.5 $\mu$m (made by Sanyo Kasei Co., Ltd.; trade name: Polymerpole), adding with 30.0 parts by weight of NMP(normal methyl pyrolidone), adjusting a viscosity to 7 Pa·s in a homodisper agitating machine and then kneading through three rolls.

Figure 6:
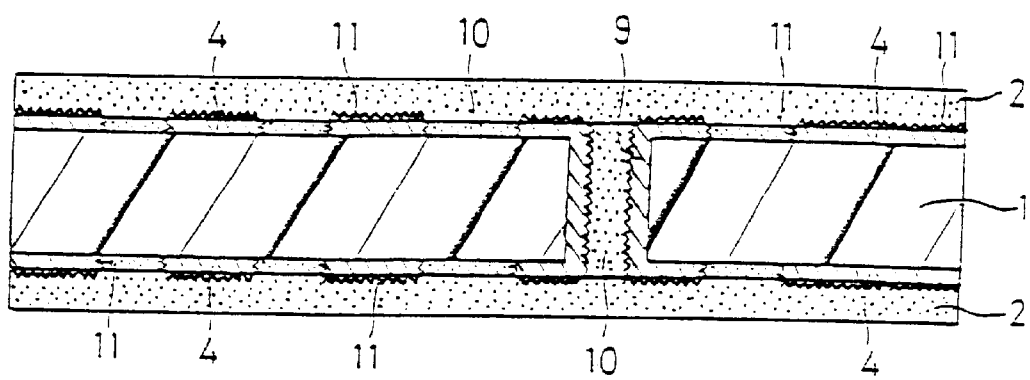
Figure 6:
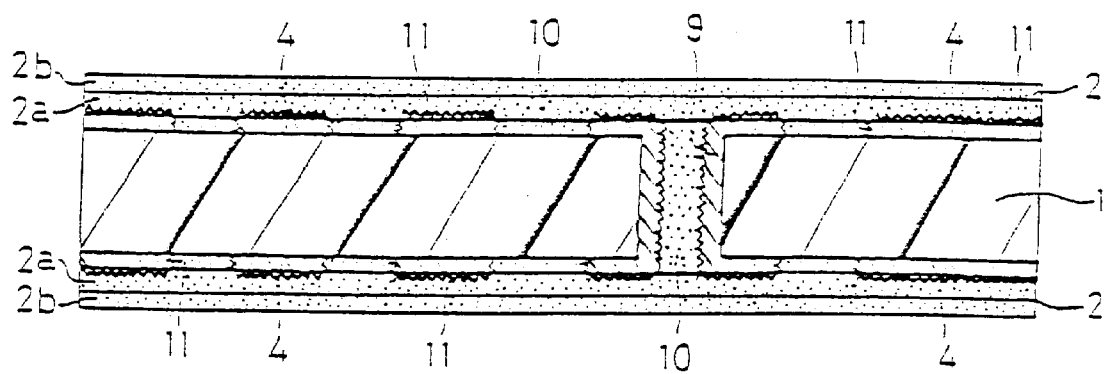

(4) The photosensitive adhesive solution obtained in step (3) is applied onto both surfaces of the substrate treated in the step (2) by means of a roll coater and left to stand at horizontal state for 20 minutes and dried at 60° C. for 30 minutes to form an adhesive layer 2 of 60 $\mu$m (see FIG. 6(*a*)).

(5) A polyethylene terephthalate film (light permeation film) is attached to each surface of the adhesive layers 2 formed on both surfaces of the substrate in the step (4) through a tackifier. Then, a sodalime glass substrate of 5 mm in thickness depicted with the same circle pattern (mask pattern) as the viahole through a light screen ink of 5 $\mu$m in thickness is closely placed on the adhesive layer 2 so as to face the circle pattern depicted side thereto and exposed to an ultraviolet ray.

(6) The light-exposed substrate is developed by spraying a DMTG (triethylene glycol dimethyl ether) solution to form openings for viahole of 100 $\mu$m on the adhesive layer 2. Further, the substrate is exposed to a super-high pressure mercury lamp at 3000 mJ/cm$^2$ and heated at 100° C. for 1 hour and at 150° C. for 5 hours to form an adhesive layer 2 of 50 $\mu$m in thickness provided with openings 6 (opening for the formation of viahole) having excellent dimensional accuracy corresponding to the photomask film. Moreover, the roughened layer 11 is partly exposed. in the opening 6 for the viahole (see FIG. 7).

Figure 8:
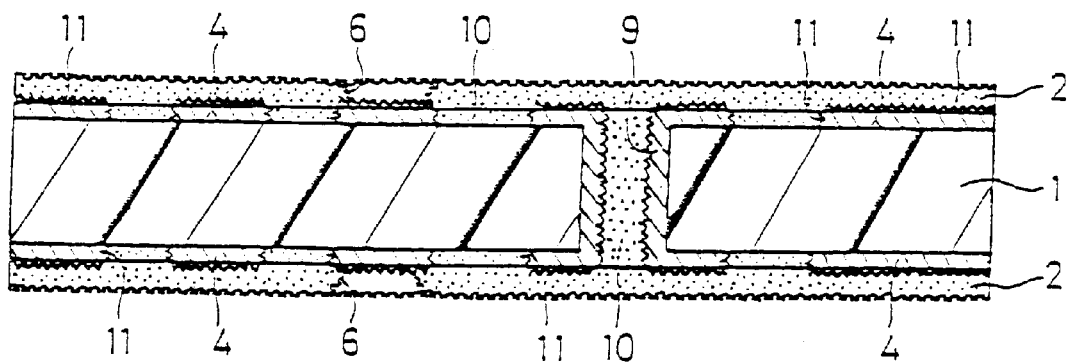

(7) The substrate having the openings 6 for the formation of viahole in the steps (5), (6) is immersed in chromic acid for 2 minutes to dissolve and remove epoxy resin particles existing in the surface area of the adhesive layer 2, whereby the surface of the adhesive layer 2 is roughened and then immersed in a neutral solution (made by Shipley) and washed with water (see FIG. 8).

(8) A catalyst nucleus is applied to the surfaces of the adhesive layer 2 and the opening 6 for the formation of viahole by giving a palladium catalyst (made by Atotech Co., Ltd.) to the substrate roughened in the step (7) (roughened depth: 5 $\mu$m).

Figure 9:
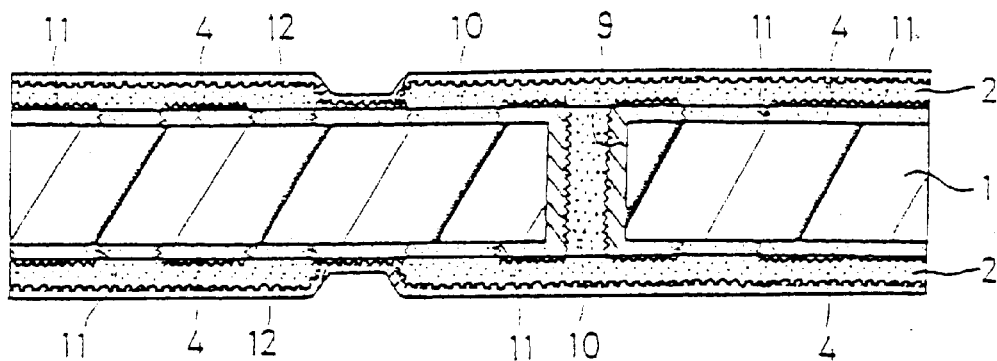

(9) The substrate is immersed in an electroless copper plating bath having the following composition to form an electroless copper plated film 12 of 3 $\mu$m in thickness over a full roughened surface (see FIG. 9).

| [Electroless plating solution] | |
| --- | --- |
| EDTA | 150 g/l |
| Copper sulfate | 20 g/l |
| HCHO | 30 ml/l |
| NaOH | 49 g/l |
| α,α'-bipyridyl | 80 mg/l |
| PEG | 0.1 g/l |

[Electroless plating condition]

A liquid temperature of 70° C. for 30 minutes

Figure 10:
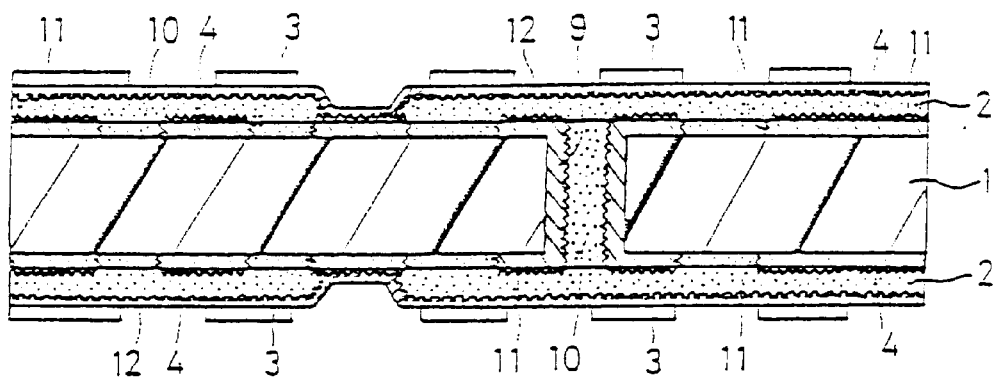

(10) A commercially available photosensitive resin film (dry film) is adhered to the electroless copper plated film 12 formed in the step (9) through thermal press and further sodalime glass substrate of 5 mm in thickness depicted with a mask pattern as a portion not forming the plating resist through chromium layer is closely placed onto the dry film so as to face the chromium layer side to the dry film, exposed to a light at 110 $\mu$mJ/cm$^2$ and developed with 0.8% sodium carbonate to form a pattern of plating resist 3 having a thickness of 15 $\mu$m (FIG. 10).

Figure 11:
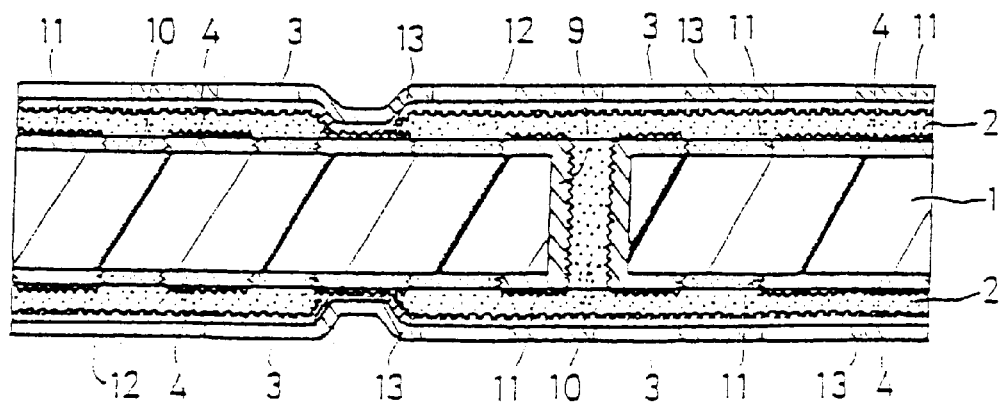

(11) Then, the portion not forming the plating resist is subjected to an electrolytic copper plating under the following conditions to form an electrolytic copper plated film 13 having a thickness of 15 $\mu$m (see FIG. 11).

| [Electrolytic plating solution] | |
| --- | --- |
| sulfuric acid | 180 g/l |
| copper sulfate | 80 g/l |
| additive (made by Atoteck Japan, trade name: Capalacid GL) | 1 ml/l |

| [Electrolytic plating condition] | |
| --- | --- |
| current density | 1.2 A/dm$^2$ |
| time | 30 minutes |
| temperature | Room temperature |

(12) After the plating resist 3 is peeled off by spraying 5% KOH, the electroless plated film 12 located beneath the plating resist 3 is dissolved and removed by etching with a mixed solution of sulfuric acid and hydrogen peroxide to form an innerlayer conductor circuit 5 consisting of the electroless copper plated film 12 and the electrolytic copper plated film 13 and having a thickness of 18 $\mu$m. Further, Pd retained in the roughened surface 11 is removed by immersing in chromic acid (800 g/l) for 1–2 minutes (see FIG. 12).

(13) The substrate provided with the conductor circuit 5 is immersed in an electroless plating solution of pH=9 containing 8 g/l of copper sulfate, 0.6 g/l of nickel sulfate, 15 g/l of citric acid, 29 g/l of sodium hypophosphite, 31 g/l of boric acid and 0.1 g/l of surfactant to form a roughened layer 11 of copper-nickel-phohsphorus having a thickness of 3 $\mu$m on the surface of the conductor circuit 5 . In this case, the roughened layer 11 has a composition ratio of Cu: 98 $\mu$mol %, Ni: 1.5% and P: 0.5 mol % as analyzed by EPMA (fluorescent X-ray analyzing device).

Figure 13:
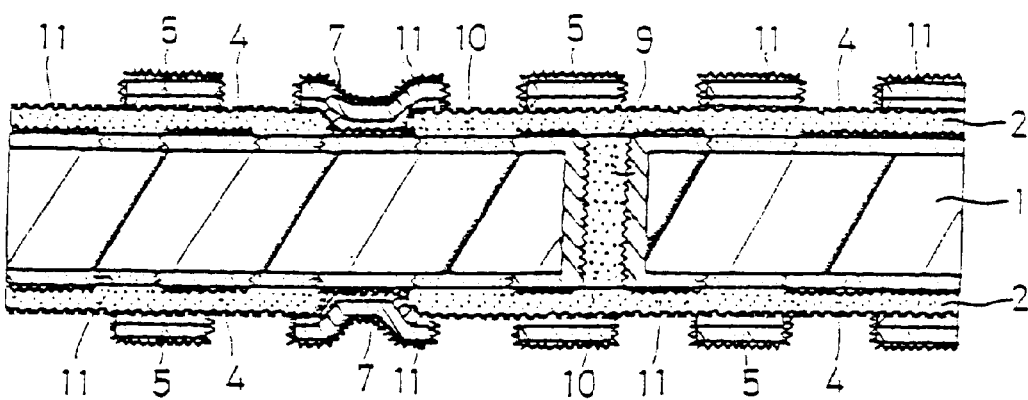

Further, the substrate is washed with water and immersed in an electroless tin substitution plating bath containing 0.1 mol/l of tin borofluoride and 1.0 mol/l of thiourea at 50° C. for 1 hour to form a tin substitution plated layer of 0.3 $\mu$m on the surface of the roughened layer 11 (see FIG. 13 provided that tin substituted layer is not shown).

Figure 14:
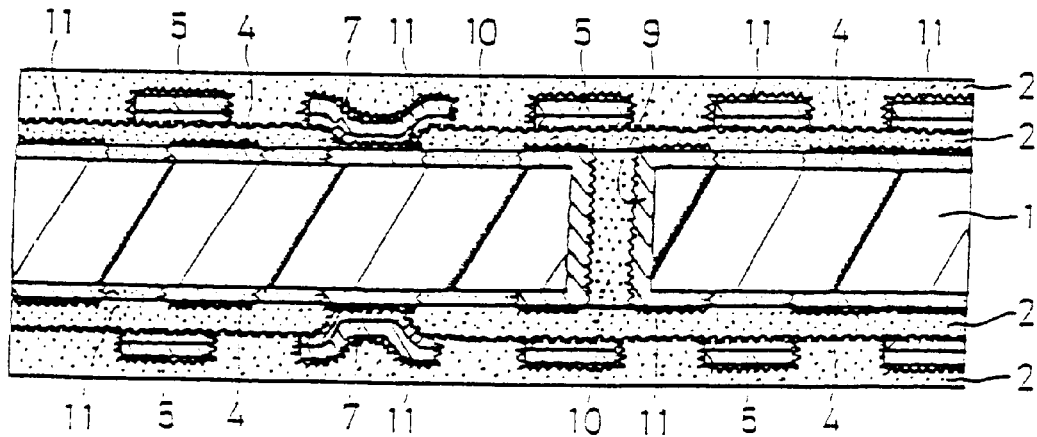
Figure 15:
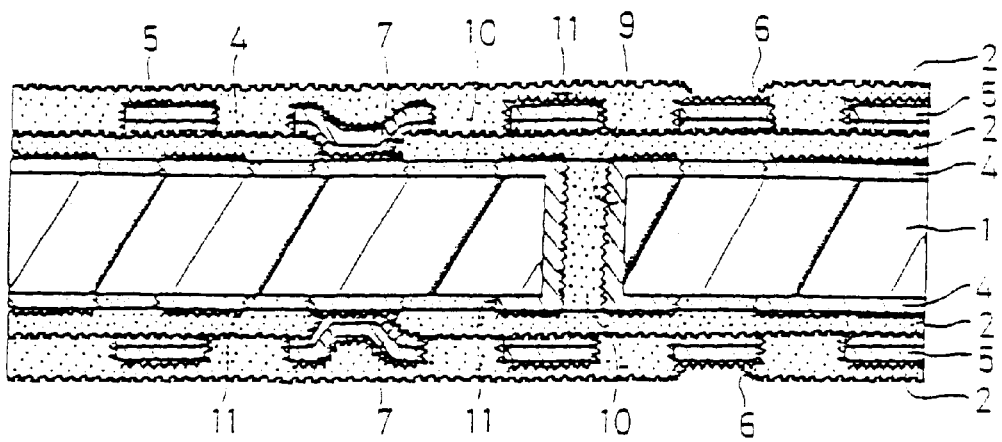
Figure 16:
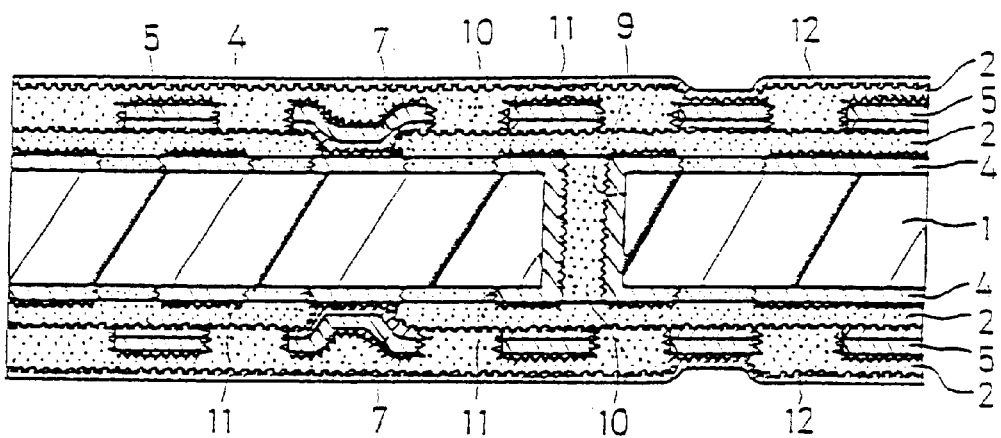
Figure 17:
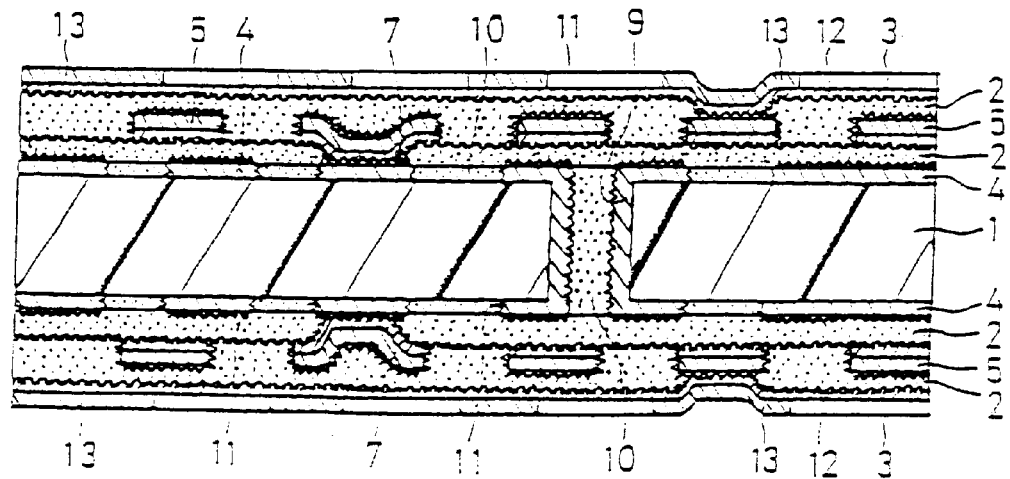
Figure 18:
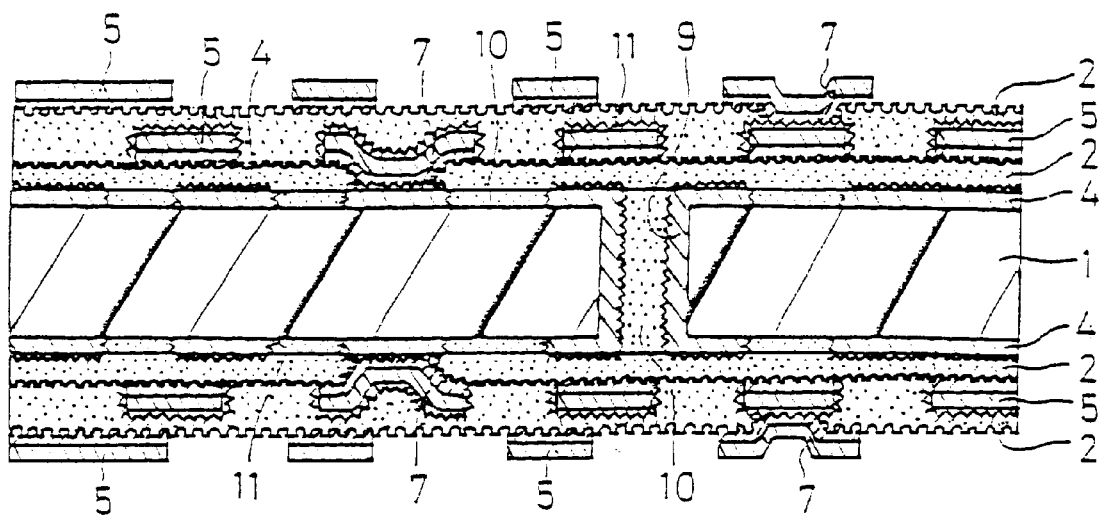
Figure 19:
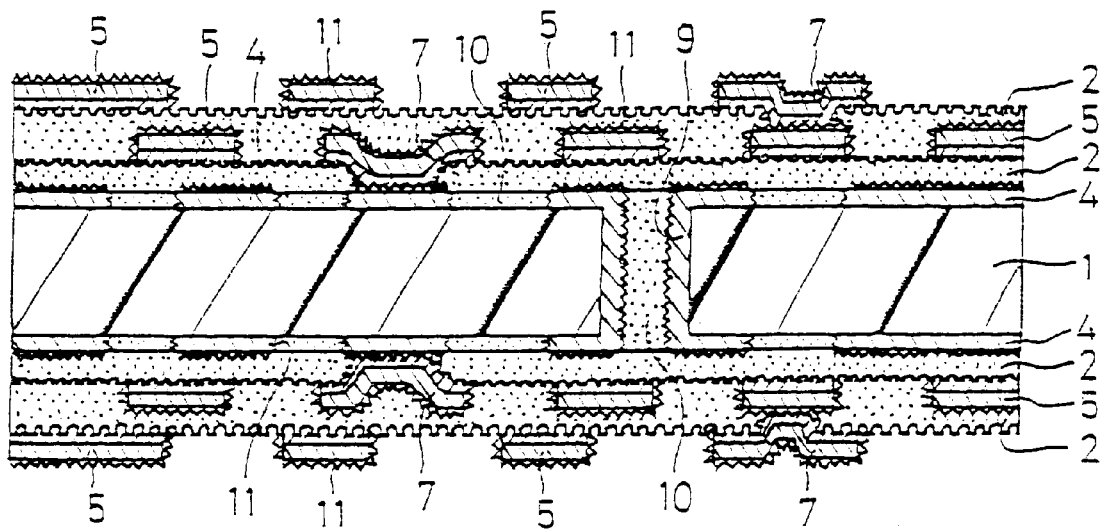

(14) An adhesive layer 2 is further formed according to the step (4) and a polyethylene terephthalate film (light permeation film) is attached to the surface thereof, which is sandwiched between stainless plates and heat-pressed by heating in a heating furnace at 65° C. while pressurizing at 20 kgf/cm$^2$. By such a heat pressing is smoothened the surface of the adhesive layer 2 is smoothened to form an interlaminar insulating resin layer (see FIG. 14).

(15) Further, conductor circuits are formed by repeating the steps (5)–(13) and a roughened layer 11 of copper-nickel-phosphorus is formed on the surface of the conductor circuit. In this case, the tin substitution plated layer is not formed on the surface of the roughened layer (see FIGS. 15–19).

(16) On the other hand, a solder resist composition is prepared by mixing 46.67 parts by weight of a photosensitized oligomer (molecular weight: 4000) obtained by acrylating 50% of epoxy group of 60% by weight of creasol novolac type epoxy resin (made by Nippon Kayaku Co., Ltd.) dissolved in DMDG, 15.0 parts by weight of 80% by weight of bisphenol A-type epoxy resin (made by Yuka Shell Co., Ltd.; trade name: Epikote 1001) dissolved in methyl ethyl ketone, 1.6 parts by weight of imidazole curing agent (made by Shikoku Kasei Co., Ltd.; trade name: 2E4MZ-CN), 3 parts by weight of polyvalent acrylmonomer (made by Nippon Kayaku Co., Ltd.; trade name: R604) as a photosensitive monomer, 1.5 parts by weight of a polyvalent acrylmonomer (made by Kyoeisha Kagaku Co., Ltd.; trade name: DPE6A) and 0.71 part by weight of a dispersion anti-foamer, adding 2 parts by weight of benzophenone (made by Kanto Kagaku Co., Ltd.) as a photoinitiator and 0.2 part by weight of Michler's ketone (made by Kanto Kagaku Co., Ltd.) as a photosensitizer to the mixture and adjusting a viscosity to 2.0 Pa·s at 25° C.

The measurement of the viscosity is carried out by B-type viscosity meter (made by Tokyo Keiki Co., Ltd.; DVL-B model) according to rotor No. 4 at 60 rpm and rotor No. 3 at 6 rpm.

(17) The above solder resist composition is applied to both surfaces of the substrate obtained in the step (15) at a thickness of 20$\mu$m. Then, it is dried at 70° C. for 20 minutes and at 70° C. for 30 minutes and thereafter a sodalime glass substrate of 5 mm in thickness depicted with circle patter (mask pattern) for solder resist opening through chromium layer is closely placed on the solder resist layer so as to face the chromium layer side thereto, exposed to an ultraviolet ray at 1000 mJ/cm$^2$ and developed with DMTG. Further, it is heated at 80° C. for 1 hour, at 100° C. for 1 hour, at 120° C. for 1 hour and at 150° C. for 3 hours to form a pattern of solder resist layer 14 (thickness: 20 $\mu$m) opening in the upper surface of the solder pad, viahole and its land portion (opening size: 200 $\mu$m).

(19) The substrate provided with the solder resist layer 14 is immersed in an electroless nickel plating solution of pH=5 containing 30 g/l of nickel chloride, 10 g/l of sodium hypophosphite and 10 g/l of sodium citrate to form a nickel plated layer 15 of 5 $\mu$m in the opening. Further, the substrate is immersed in an electroless gold plating solution containing 2 g/l of potassium gold cyanide, 75 g/l of ammonium chloride, 50 g/l of sodium citrate and 10 g/l of sodium hypophosphite at 93° C. for 23 seconds to form a gold plated layer 16 of 0.03 $\mu$m on the nickel plated layer 15.

Figure 20:
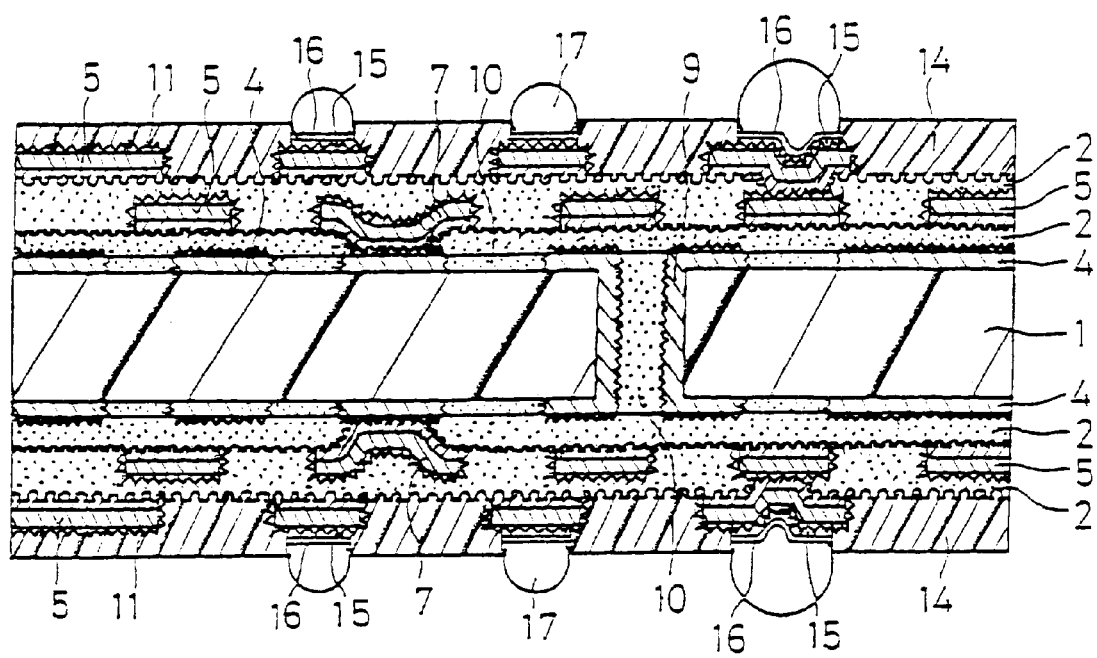

A solder paste is printed on the opening of the solder resist layer 14 and reflowed at 200° C. to form a solder bump (solder body) 17, whereby there is produced a printed circuit board having solder bumps (see FIG. 20).

EXAMPLE 2

Full-additive Process (1) A photosensitive adhesive solution for electroless plating (interlaminar insulating resin agent) is prepared by mixing 34 parts by weight of 25% acrylated product of cresol novolac type epoxy resin (made by Nippon Kayaku Co., Ltd.; molecular weight: 2500) dissolved in DMDG (diethylene glycol dimethy ether), 12 parts by weight of polyether sulphone (PES), 2 parts by weight of imidazole curing agent (made by Shikoku Kasei Co., Ltd.; trade name: 2E4MZ-CN), 4 parts by weight of caprolactone modified tris(acroxyethyl)isocyanurate (made by Toa Gosei Co., Ltd.; trade name: Acronix M315) as a photosensitive monomer, 2 parts by weight of a photoinitiator (made by Ciba Geigy.; trade name: Irgaquar 907), 0.2 part by weight of a photosensitizer (made by Nippon Kayaku Co., Ltd.; trade name: DETX-S), 15 parts by weight of epoxy resin particles having an average particle size of 1.0 $\mu$m, and 10 parts by weight of epoxy resin particles having an average particle size of 0.5 $\mu$m (made by Sanyo Kasei Co., Ltd.; trade name: Polymerpole), and adding 30.0 parts by weight of NMP (normal methyl pyrolidone), adjusting viscosity to 7 Pa·s in a homodisper agitating machine and kneading through three rolls.

(2) The adhesive solution for electroless plating obtained in the step (1) is applied to both surfaces of a core substrate by means of a roll coater according to the steps (1), (2) of Example 1, left to stand at horizontal state for 20 minutes and dried at 60° C. for 30 minutes to form an adhesive layer 2 having a thickness of 60 $\mu$m.

(3) A polyethylene terephthalate film (light permeation film) is attached onto the adhesive layer 2 formed on each surface of the substrate in the step (2) through a tackifier. Then, sodalime glass substrate of 5 mm in thickness depicted with the same circle pattern (mask pattern) as the viahole through a light screen ink of 5 $\mu$m in thickness is closely placed onto the adhesive layer 2 so as to face the circle pattern side thereto and exposed to an ultraviolet ray.

(4) The exposed substrate is developed by spraying DMTG (triethylene glycol dimethyl ether) solution from an opening of 100 $\mu$m as a viahole in the adhesive layer 2. Further, the substrate is exposed to a super-high pressure mercury lamp at 3000 mJ/cm$^2$ and heated at 100° C. for 1 hour and at 150° C. for 5 hours to form an adhesive layer 2 of 45 $\mu$m in thickness provided with the opening 6 (opening for the formation of viahole) having excellent dimensional accuracy corresponding to the photomask. Moreover, the roughened layer 11 is partly exposed in the opening 6 as a viahole (see FIG. 7).

(5) The substrate provided with the opening 6 for the formation of viahole is immersed in chromic acid for 2 minutes to dissolve and remove the epoxy resin particles existin in the surface area of the adhesive layer 2, whereby the surface of the adhesive layer 2 is roughened and then immersed in a neutral solution (made by Shipley) and washed with water (see FIG. 8).

(6) On the other hand, a mixed solution A is prepared by mixing 46.7 parts by weight of a photosensitized oligomer obtained by acrylating 50% of epoxy group in cresol novolac type epoxy resin (made by Nippon Kayaku Co., Ltd.; trade name: ECON-103S) dissolved in DMDG, 15.0 parts by weight of 80 parts by weight of bisphenol A-type epoxy resin (made by Yuka Shell Co., Ltd.; trade name: Epikote 1001) dissolved in methylethyl ketone), 1.6 parts by weight of imidazole curing agent (made by Shikoku Kasei Co., Ltd.; trade name: 2E4MZ-CN), 3 parts by weight of a polyvalent acrylate (made by Nippon Kayaku Co., Ltd.; trade name: R-604) as a photosensitive monomer and 1.5 parts by weight of polyvalent acryl monomer (made by Kyoei Kagaku Co., Ltd.; trade name: DPE-6A), adding 0.5 part by weight of apolymer of acrylic ester (made by Kyoei Kagaku Co., Ltd.; trade name: Polyflow 75) to total weight of the resulting mixture and agitating them.

Further, a mixed solution B is prepared by dissolving 2 parts by weight of benzophenone (made by Kanto Kagaku Co., Ltd.) as a photoinitiator and 0.2 part by weight of Michler's ketone (made by Kanto Kagaku Co., Ltd.) as a photosensitizer in 3 parts by weight of DMDG warmed at 40° C.

Then, the mixed solution A is mixed with the mixed solution B to form a liquid resist.

Figure 21:
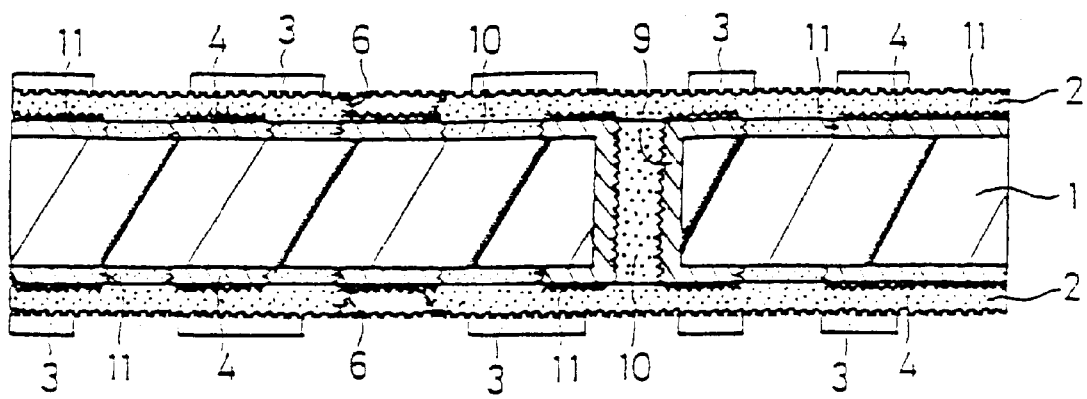
FIGS. 21–24 are diagrammatic views illustrating steps in the production of the multilayer printed circuit board through full-additive process using the adhesive for electroless plating according to the invention, wherein the reference numeral 1 indicates a substrate, 2 an interlaminar insulating resin layer(adhesive layer for electroless palting), 3 a permanent resist(plating resist), 4 an inner conductor circuit(inner layer pattern), 5 an inner conductor circuit(second layer pattern), 6 an a opening for viahole, 7 a viahole, 8 a copper foil, 9 a through hole, 10 a resin filler, 11 a roughened layer, 12 an electroless plated film, 13 an electrolytic plated film, 14 a solder resist layer, 15 a nickel plating layer, 16 a gold plating layer, and 17 a solder body(solder bump).

(7) The liquid resist is applied onto the substrate treated in step (5) by means of a roll coater and dried at 60° C. for 30 minutes to form a resist layer having a thickness of 30 $\mu$m. Then, a mask film depicted with a conductor circuit pattern of L/S (ratio of line to space)=50/50 is closed, exposed to a super-high pressure mercury lamp at 1000 mJ/cm$^2$ and developed by spraying DMDG to form a plating resist removing the conductor circuit pattern portion in the substrate, which is further exposed to a super-high pressure mercury lamp at 6000 mJ/cm$^2$ and heated at 100° C. for 1 hour and at 150° C. for 3 hours to form a permanent resist 3 on the adhesive layer 2 (interlaminar insulating resin layer) (see FIG. 21).

(8) The substrate provided with the permanent resist 3 is immersed in an aqueous solution of 100 g/l of sulfuric acid to activate a catalyst nucleus, which is subjected to a primary plating in an electroless copper-nickel alloy plating bath having the following composition to form a thin plated film of copper-nickel-phosphorus alloy having a thickness of about 1.7 $\mu$m on the portion not forming the resist. In this case, the temperature of the plating bath is 60° C. and the plating time is 1 hour.

| | |
|---|---|
| Metal salts . . . CuSO$_4$ 5H$_2$O | 6.0 mM (1.5 g/l) |
| . . . NiSO$_4$ 6H$_2$O | 95.1 mM (25 g/l) |
| Complexing agent . . . Na$_3$C$_6$H$_5$O$_7$ | 0.23 M (60 g/l) |
| Reducing agent . . . NaPH$_2$O$_2$ H$_2$O | 0.19 M (20 g/l) |
| pH adjusting agent . . . NaOH | 0.75 M (pH = 9.5) |
| Stabilizer . . . lead nitrate | 0.2 mM (80 ppm) |
| Surfactant | 0.05 g/l |

The precipitation rate is 1.7 $\mu$m/h.

(9) The substrate subjected to the primary plating is taken out from the plating bath, washed with water to remove the plating solution adhered to the surface and further treated with an acidic solution to remove oxide film on the surface layer of copper-nickel-phosphorus thin plated film.

Figure 22:
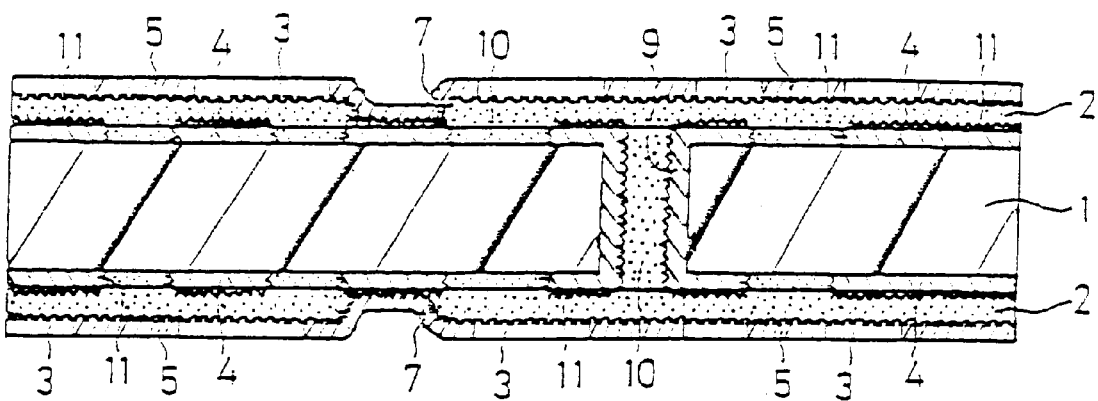

Thereafter, the copper-nickel-phosphorus thin plated film is subjected to a secondary plating in an electroless copper plating bath having the following composition with-out Pd substitution to form outerlayer conductor pattern required as a conductor in additive process and viahole (BVH) (see FIG. 22). In this case, the temperature of the plating bath is 50–70° C. and the plating time is 90–360 minutes.

| | |
|---|---|
| Metal salt . . . CuSO$_4$.5H$_2$O | 8.6 mM |
| Complexing agent . . . TEA | 0.15 M |
| Reducing agent . . . HCHO | 0.02 M |
| Others . . . stabilizer (bipyridyl, potassium ferrocyanide and the like) | small amount |
| Precipitation rate | 6 $\mu$m/h |

(10) After the conductor layer is formed by additive process, the one-side surface of the substrate is polished by belt sander polishing with a #600 belt polishing paper so as to align the upper surface of the permanent resist, the upper surface of the conductor circuit and the upper land surface of the viahole to each other. Subsequently, buffing is carried out for removing the scratch produced by the belt sander (only the buffing may be sufficient). The other side surface is subjected to the same polishing as mentioned above to obtain a printed wiring substrate, both surfaces of which being smooth.

Figure 23:
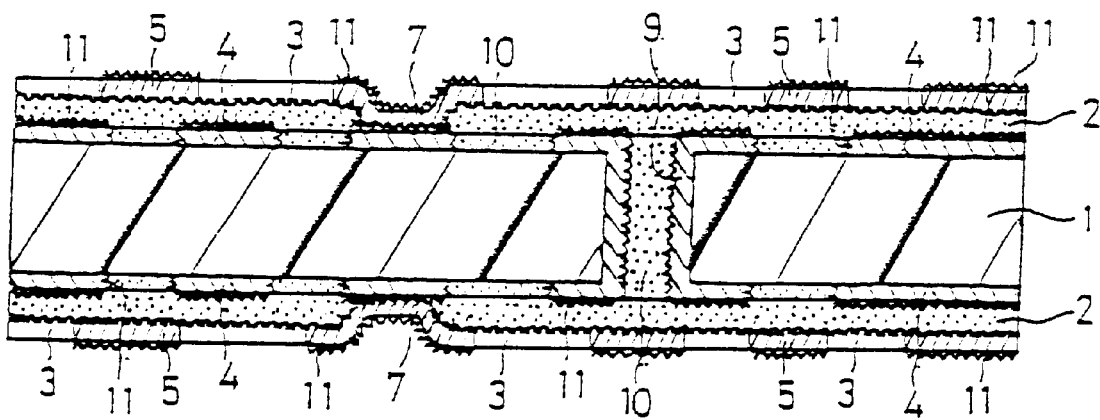

(11) The surface-smoothened printed wiring substrate is immersed in an electroless plating solution of pH=9 containing 8 g/l of copper sulfate, 0.6 g/l of nickel sulfate, 15 g/l of citric acid, 29 g/l of sodium hypophosphorite, 31 g/l of boric acid and 0.1 g/l of surfactant to form a roughened layer 11 of copper-nickel-phosphorus alloy having a thickness of 3 μm on the surface of the conductor exposed from the surface of the substrate (see FIG. 23).

Thereafter, a conductor layer is further formed through additive process by repeating the above steps to form another wiring layer. In this way, there is provided a multilayer printed circuit board having 6 wiring layers.

Figure 24:
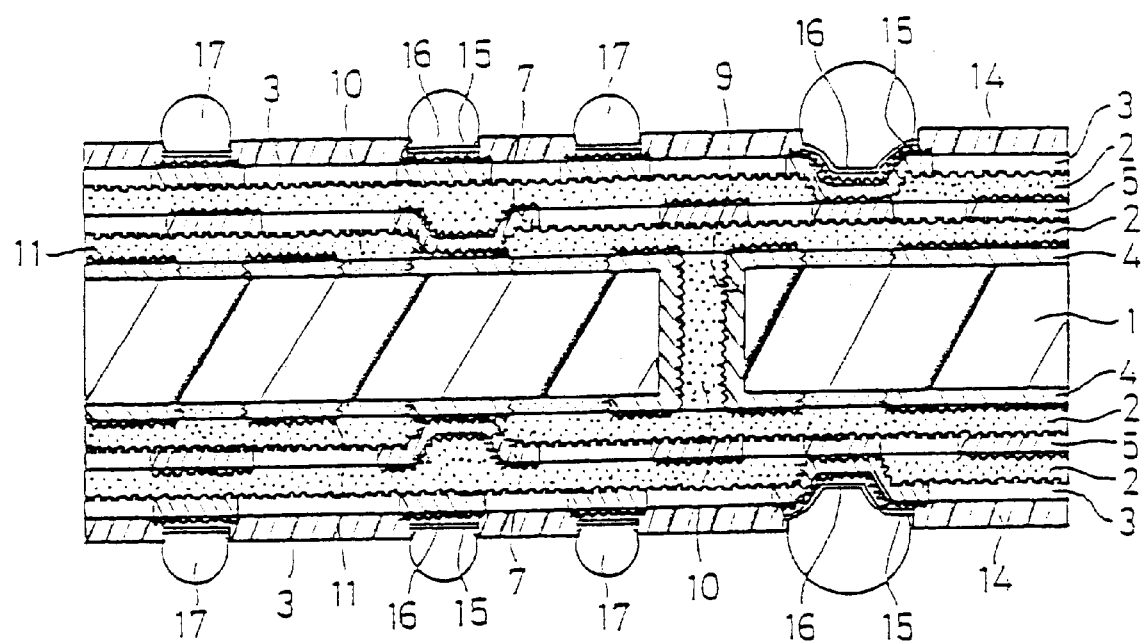

(12) Further, a solder resist layer 14 and a solder bump 17 are formed according to the steps (16)–(20) of Example 1 to produce a printed circuit board having solder bumps 17 (see FIG. 24).

COMPARATIVE EXAMPLE 1

Semi-additive Process (3.9 μm/0.5 μm)

The printed circuit board having solder bumps is produced in the same manner as in Example 1 except that the following adhesive solution for electroless plating is used.

That is, the photosensitive adhesive solution for electroless plating (interlaminar insulating resin agent) is prepared by mixing 34 parts by weight of 25% acrylated product of cresol novolac type epoxy resin (made by Nippon Kayaku Co., Ltd.; molecular weight: 2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 4 parts by weight of caprolactone modified tris(acroxyethyl) isocyanurate (made by Toa Gosei Co., Ltd.; trade name: Aronix M315) as a photosensitive monomer, 2 parts by weight of a photo-initiator (made by Ciba Geigy; trade name: Irgaquar 907), 0.2 part by weight of a photosensitizer (made by Nippon Kayaku Co., Ltd.; trade name: DETX-S), 10 parts by weight of epoxy resin particles having an average particle size of 3.9 μm and 25 parts by weight of the epoxy resin particles having an average particle size of 0.5 μm(made by Toray Co., Ltd.; trade name: Toreparle), adding 30.0 parts by weight of NMP (normal methyl pyrolidone), adjusting viscosity to 7 Pa·s in a homodisper agitating machine and kneading through three rolls.

COMPARATIVE EXAMPLE 2

Semi-additive Process 1.6 μm Ground Powder+Epoxy/PES Matrix (1) Epoxy resin particles are prepared according to a method described in JP-A-61-276875 (U.S. Pat. No. 4,752,499, U.S. Pat. No. 5,021,472.

That is, epoxy resin (made by Mitsui Petrochemical Industries, Ltd.; trade name: TA-1800) is cured by drying. in a hot air dryer at 180° C. for 4 hours and the cured epoxy resin is roughly ground and sieved using a supersonic jet grinding machine (made by Nippon Pneumatic Kogyo Co., Ltd.; trade name: Aqucut B-18 model) while freezing with liquid nitrogen, whereby there are prepared epoxy resin particles having an average particle size of 1.6 μm.

(2) The production of the printed circuit board is carried out in the same manner as in Example 1 except that the following adhesive solution for electroless plating is used.

That is, the photosensitive adhesive solution for electroless plating (interlaminar insulating resin agent) is prepared by mixing 34 parts by weight of 25% acrylated product of cresol novolac type epoxy resin (made by Nippon Kayaku Co., Ltd.; molecular weight:2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 4 parts by weight of caprolactone modified tris(acroxyethyle) isocyanurate (made by Toa Gosei Co., Ltd.; trade name: Aronix M315) as a photosensitive monomer, 2 parts by weight of a photoinitiator (made by Ciba Geigy; trade name: Irgaquar 907), 0.2 part by weight of a photosensitizer (made by Nippon Kayaku Co., Ltd.; trade name: DETX-S) and 35 parts by weight of the epoxy resin particles of the above step (1) having an average particle size of 1.6 μm, adding 30.0 parts by weight of NMP (normal methyl pyrolidone), adjusting viscosity to 7 Pa·s in a homodisper agitating machine and then kneading through three rolls.

COMPARATIVE EXAMPLE 3

Semi-additive Process 1.6 μm Particles+Epoxy/PES Matrix

The printed circuit board having solder bumps is produced in the same manner as in Example 1 except that the following adhesive solution for electroless plating is used.

That is, the photosensitive adhesive solution for electroless plating (interlaminar insulating resin agent) is prepared by mixing 34 parts by weight of 25% acrylated product of cresol. novolac type epoxy resin (made by Nippon Kayaku Co., Ltd.; molecular weight:2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 4 parts by weight of caprolactone modified tris(acroxyethyle) isocyanurate (made by Toa Gosei Co., Ltd.; trade name: Aronix M315) as a photosensitive monomer, 2 parts by weight of a photoinitiator (made by Ciba Geigy; trade name: Irgaquar 907), 0.2 part by weight of a photosensitizer (made by Nippon Kayaku Co., Ltd.; trade name: DETX-S) and 35 parts by weight of the epoxy resin particles (made by Toray Co., Ltd.; trade name: Toreparle) having an average particle size of 1.6μm, adding 30.0 parts by weight of NMP (normal methyl pyrolidone), adjusting a viscosity to 7 Pa·s in a homodisper agitating machine and then kneading through three rolls.

COMPARATIVE EXAMPLE 4

Full-additive Process 3.9 μm/0.5 μm

The printed circuit board having solder bumps is produced in the same manner as in Example 2 except that the following adhesive solution for electroless plating is used.

That is, the photosensitive adhesive solution for electroless plating (interlaminar insulating resin agent) is prepared by mixing 34 parts by weight of 25% acrylated product of cresol novolac type epoxy resin (made by Nippon Kayaku Co., Ltd.; molecular weight:2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 4 parts by weight of caprolactone modified tris(acroxyethyle) isocyanurate (made by Toa Gosei Co., Ltd.; trade name: Aronix M315) as a photosensitive monomer, 2 parts by weight of a photoinitiator (made by Ciba Geigy; trade name: Irgaquar 907), 0.2 part by weight of a photosensitizer (made by Nippon Kayaku Co., Ltd.; trade name: DETX-S), 10 parts by weight of the epoxy resin particles having an average particle size of 3.9 µm and 25 parts by weight of the epoxy resin particles having an average particle size of 0.5 µm (made by Toray Co., Ltd.; trade name: Toreparle), adding 30.0 parts by weight of NMP (normal methyl pyrolidone), adjusting viscosity to 7 Pa·s in a homodisper agitating machine and then kneading through three rolls.

COMPARATIVE EXAMPLE 5

Full-additive Process 1.6 µm Ground Powder+Epoxy/PES Matrix (1) Epoxy resin particles are prepared according to a method described in JP-A-61-276875.

That is, epoxy resin (made by Mitsui Petrochemical Industries, Ltd.; trade name: TA-1800) is cured by drying in a hot air dryer at 180° C. for 4 hours and the cured epoxy resin is roughly ground and sieved by using a supersonic jet grinding machine (made by Nippon Pneumatic Kogyo Co., Ltd.; trade name: Aqucut B-18 model) while freezing with liquid nitrogen, whereby there are prepared epoxy resin particles having an average particle size of 1.6 µm.

(2) The production of the printed circuit board is carried out in the same manner as in Example 2 except that the following adhesive solution for electroless plating is used.

That is, the photosensitive adhesive solution for electroless plating (interlaminar insulating resin agent) is prepared by mixing 34 parts by weight of 25% acrylated product of cresol novolac type epoxy resin (made by Nippon Kayaku Co., Ltd.; molecular weight:2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 4 parts by weight of caprolactone modified tris(acroxyethyle) isocyanurate (made by Toa Gosei Co., Ltd.; trade name: Aronix M315) as a photosensitive monomer, 2 parts by weight of a photoinitiator (made by Ciba Geigy; trade name: Irgaquar 907), 0.2 part by weight of a photosensitizer (made by Nippon Kayaku Co., Ltd.; trade name: DETX-S) and 35 parts by weight of the epoxy resin particles of the above step (1) having an average particle size of 1.6 µm, adding 30.0 parts by weight of NMP (normal methyl pyrolidone), adjusting a viscosity to 7 Pa·s in a homodisper agitating machine and then kneading through three rolls.

COMPARATIVE EXAMPLE 6

Full-additive Process 1.6 µm Particles+Epoxy/PES Matrix

The printed circuit board having solder bumps is produced in the same manner as in Example 2 except that the following adhesive solution for electroless plating is used.

That is, the photosensitive adhesive solution for electroless plating (interlaminar insulating resin agent) is prepared by mixing 34 parts by weight of 25% acrylated product of cresol novolac type epoxy resin (made by Nippon Kayaku Co., Ltd.; molecular weight:2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 4 parts by weight of caprolactone modified tris(acroxyethyle) isocyanurate (made by Toa Gosei Co., Ltd.; trade name: Aronix M315) as a photosensitive monomer, 2 parts by weight of a photoinitiator (made by Ciba Geigy; trade name: Irgaquar 907), 0.2 part by weight of a photosensitizer (made by Nippon Kayaku Co., Ltd.; trade name: DETX-S) and 35 parts by weight of the epoxy resin particles (made by Toray Co., Ltd.; trade name: Toreparle) having an average particle size of 1.6 µm, adding 30.0 parts by weight of NMP (normal methyl pyrolidone), adjusting viscosity to 7 Pa·s in a homodisper agitating machine and then kneading through three rolls.

COMPARATIVE EXAMPLE 7

Semi-additive Process 5.5 µm/0.5 µm (JP-A-7-34048, U.S. Pat. No. 5,519, 177)

The printed circuit board having solder bumps is produced in the same manner as in Example 1 except that the following adhesive solution for electroless plating is used.

That is, the photosensitive adhesive solution for electroless plating (interlaminar insulating resin agent) is prepared by mixing 34 parts by weight of 25% acrylated product of cresol novolac type epoxy resin (made by Nippon Kayaku Co., Ltd.; molecular weight:2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 5 parts by weight of trimethyl triacrylate (TMPTA) as a photosensitive monomer, 2 parts by weight of a photoinitiator (made by Ciba Geigy; trade name: Irgaquar 907), 10 parts by weight of the epoxy resin particles having an average particle size of 5.5 µm and 5 parts by weight of the epoxy resin particles having an average particle size of 0.5 µm (made by Toray Co., Ltd.; trade name: Toreparle), adding 30.0 parts by weight of NMP (normal methyl pyrolidone), adjusting viscosity to 7 Pa·s in a homodisper agitating machine and then kneading through three rolls.

COMPARATIVE EXAMPLE 8

Full-additive Process 5.5 µm/0.5 µm (JP-A-7-34048, U.S. Pat. No. 5,519, 177)

The printed circuit board having solder bumps is produced in the same manner as in Example 2 except that the following adhesive solution for electroless plating is used.

That is, the photosensitive adhesive solution for electroless plating (interlaminar insulating resin agent) is prepared by mixing 34 parts by weight of 25% acrylated product of cresol novolac type epoxy resin (made by Nippon Kayaku Co., Ltd.; molecular weight:2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 5 parts by weight of trimethyl triacrylate (TMPTA) as a photosensitive monomer, 2 parts by weight of a photoinitiator (made by Ciba Geigy; trade name: Irgaquar 907), 10 parts by weight of the epoxy resin particles having an average particle size of 5.5 µm and 5 parts by weight of the epoxy resin particles having an average particle size of 0.5 µm(made by Toray Co., Ltd.; trade name: Toreparle), adding 30.0 parts by weight of NMP (normal methyl pyrolidone), adjusting viscosity to 7 Pa·s in a homodisper agitating machine and then kneading through three rolls.

EXAMPLE 3

Example using material composition for the preparation of the adhesive each preserved in separated manner.

The printed circuit board is produced in the same manner as in Example 1 except that the adhesive for electroless plating is prepared by the following groups 1–3 of material compositions.

A. Material compositions for the preparation of adhesive for electroless plating(adhesive for upper layer).

<group 1>

35 parts by weight of 25% acrylated product of cresol novolac type epoxy resin (2500 in molecular weight, made by Nippon Kayaku Co., Ltd.) as a 80% by weight solution in DMDG(diethylene glycol dimethyl ether), 3.15 parts by weight of a photosensitive monomer(made by Toa Gosei Co., Ltd.; trade name: Aronix M315), 0.5 parts by weight of antiforming agent(made by SANNOPCO; tradename: S-65), and 3.6 parts by weight of NMP are mixed together by agitation to obtain group 1 composition.

<group 2>

12 parts by weight of polyether sulfone (PES), 7.2 parts by weight of epoxy resin having an average particle size of 1.0 µm and 3.09 parts by weight of the same having the average particle size of 0.5 µm(POLYMERPOLE by Sanyo Kasei Co., Ltd.) are mixed together and then 30 parts by weight of NMP were added to the mixture. They are mixed together by agitation to obtain group 2 composition.

<group 3>

2 parts by weight of imidazole curing agent (2E4MZ-CN by Shikoku Kasei Co., Ltd.), 2 parts by weight of photoinitiator (IRGACURE I-907 by Ciba Geigy), 0.2 part by weight of photosensitizer (DETX-S by Nippon Kayaku Co., Ltd.) and 1.5 parts by weight of NMP are mixed together by agitation to obtain group 3 composition.

The compositions of groups 1–3 are preserved in a separated manner to one another at the temperature of 25° C. for a month.

B. Material Compositions for the preparation of interlaminar insulating resin agent(adhesive for lower layer).

<group 1>

35 parts by weight of 25% acrylated product of cresol type epoxy resin (2500 in molucular weight, by Nippon Kayaku Co., Ltd.) as a 80% by weight solution in DMDG (diethylene glycol dimethyl ether), 4 parts by weight of a photosensitive monomer(made by Toa Gosei Co., Ltd.; trade name: Aronix M315), 0.5 parts by weight of anti-forming agent(made by SANNOPCO, tradename: S-65), and 3.6 parts by weight of NMP, are mixed together by agitation to obtain group 1 composition.

<group 2>

12 parts by weight of polyether sulfone (PES), 14.49 parts by weight of epoxy resin having the average particle size of 0.5 µm(POLYMERPOLE by Sanyo Kasei Co., Ltd.) are mixed together and then 30 parts by weight of NMP are added to the mixture. They are mixed together by agitation to obtain group 2 composition.

<group 3>

2 parts by weight of imidazole curing agent (2E4MZ-CN by Shikoku Kasei Co., Ltd.), 2 parts by weight of photoinitiator (IRGACURE I-907 by Ciba Geigy), 0.2 part by weight of photosensitizer(DETX-S by Nippon Kayaku Co., Ltd.) and 1.5 parts by weight of NMP are mixed together by agitation to obtain group 3 composition.

These compositions of groups 1–3 are preserved in a separated manner to one another at the temperature of 25° C. for a month.

C. Material Compositions for the preparation of resin filler.

<group 1>

100 parts by weight of a bisphenol F type epoxy monomer (made by Yuka Shell Co., Ltd.; 310 in molecular weight; tradename: YL983U), 170 parts by weight of spherical $SiO_2$ particles (made by Admatech Co., Ltd.; trade name: CRS 1101-CE, where the maximum particle size is set to below the thickness (15 µm) of an internal layer copper pattern mentioned below) coated with a silane coupling agent on their surfaces and having an average particle size of 1.6 µm, and 1.5 parts by weight of a leveling agent (made by Sannopko; trade name: Pernol S4) are mixed together by agitation, and adjusted in viscosity to the range from 45,000 to 49,000 cps at 23±1° C. to obtain group 1 composition.

<group 2>

Imidazole curing agent (made by Shikoku Kasei Co., Ltd.; trade name: 2E4MZ-CN) of 6.5 parts by weight.

The compositions of groups 1 and 2 are preserved in a separated manner to each other at the temperature of 25° C. for a month.

D. Material compositions for the preparation of the liquid solder resist.

<group 1>

100 parts by weight of a photosensitized oligomer (4,000 in molecular weight) obtained by acrylating 50% of epoxy groups of a cresol novolac type epoxy resin (made by Nippon Kayaku Co., Ltd.), 32 parts by weight of a bisphenol A type epoxy resin (made by Yuka Shell Co., Ltd.; trade name: Epikote 1001) as a 80% by weight solution in methyl ethyl ketone, 6.4 parts by weight of a polyvalent acrylic monomer (made by Nippon Kayaku Co., Ltd.; trade name: R604) as a photosensitive monomer, and 3.2 parts by weight of a polyvalent acrylic monomer (made by Kyoeisha Chemical Co., Ltd.; trade name: DPE6A), are mixed, and then 0.5 part by weight of a leveling agent(made by Kyoeisha Chemical Co., Ltd.; trade name: Polyflow No. 75) is added to the mixture and mixed together by agitation to obtain group 1 composition.

<group 2>

3.4 parts by weight of imidazole curing agent (made by Shikoku Kasei Co., Ltd.; trade name: 2E4MZ-CN), 2 parts by weight of photoinitiator(IRGACURE I-907 by Ciba Geigy), 0.2 parts by weight of a photosensitizer (DETX-S by Nippon Kayaku Co., Ltd. ), and 1.5 part by weight of NMP are mixed together by agitating to obtain group 2 composition.

The compositions of groups 1 and 2 are preserved in a separated manner to each other at the temperature of 25° C. for a month.

E. Manufacturing of the printed circuit board.

(1) The steps (1) and (2) of Example 1 are carried out.

(2) The material compositions B for the preparation of the interlaminar insulating resin agent are mixed together by agitation, and adjusted in viscosity to 1.5 Pa·s to obtain an interlaminar insulating resin agent(for lower layer).

The material compositions A for the preparation of adhesive for electroless plating are mixed together by agitating, and adjusted in viscosity to 7 Pa·s to obtain an adhesive solution for the electroless plating(for upper layer).

(3) The interlaminar insulating resin agent(for the lower layer) having a viscosity of 1.5 Pa·s prepared in the above step (2) is applied to both surfaces of the substrate within 24 hours after preparing the compositions B, by means of a roll coater and left to stand at horizontal state for 20 minutes and dried(pre-bake) at 60° C. for 30 minutes, and then the adhesive solution (for the upper layer) having a viscosity of 7 Pa·s prepared at the above step (2) is applied to the former layers within 24 hours after preparing the compositions A, and left to stand at horizontal state for 20 minutes and dried(pre-bake) at 60° C. for 30 minutes to form an adhesive layer(two-layer structure) of 35 µm (see FIG. 6(b)).

Figure 7:
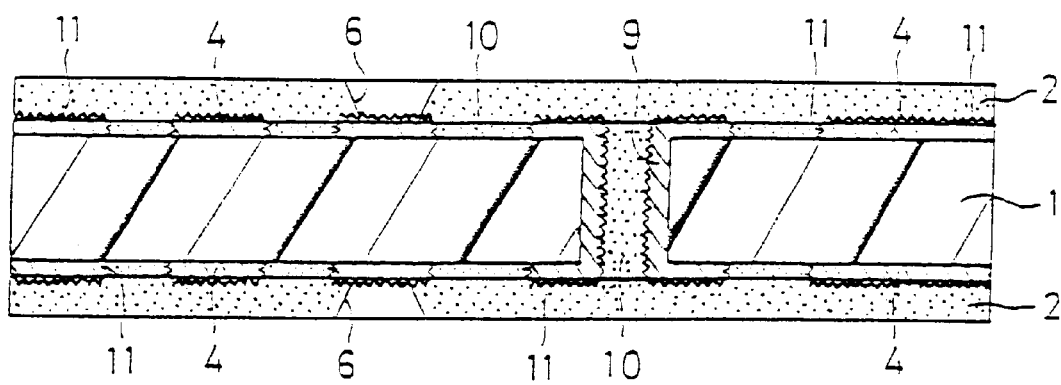

The two-layer structure will be omitted in the drawings as from FIG. 7.

(4) A photomask film depicted with a full circle (black circle) of 85 µm in diameter is attached to both surfaces of the adhesive layers 12 formed on both surfaces of the substrate in the above step (3) and exposed to a light irradiation at 500 mJ/cm² by an ultra-high pressure mercury lamp. The exposed substrate is developed by spraying a DMDG (diethylene glycol dimethyl ether) solution, and further exposed to a light irradiation at 3,000 mJ/cm² by an ultra-high pressure mercury lamp and heated at 100° C. for 1 hour and subsequently at 120° C. for 1 hour and then heated at 150° C. for 3 hours (post-bake) to form an interlaminar insulating material layer(two-layer structure) 2 of 35 µm in thickness provided with openings (openings 6 for the formation of viahole) having excellent dimensional precision corresponding to the photomask film (see FIG. 7). Incidentally, the tin plated layer is partly exposed in the opening for the viahole.

(5) The substrate provided with the openings 6 for the formation of the viahole is immersed in chromic acid for 19 minutes to dissolve and remove the epoxy resin particles on the surface of the adhesive layer 2, whereby the surface of the adhesive layer 2 is roughened, and then immersed in a neutralizing solution (made by Shipley) and washed with water.

Further, catalyst nuclei are applied to the surfaces of the adhesive layer 2 and the openings 6 for the formation of the viahole by giving a palladium catalyst (made by Atotech Co., Ltd.) to the substrate having the roughened surface (roughened depth: 6 µm) of the adhesive layer.

(6) The substrate is immersed in an electroless copper plating bath having the following composition to form an electroless copper plated film 12 of 0.6 µm in thickness all over the roughened surface (see FIG. 9).

| [Electroless plating solution] | |
|---|---|
| EDTA | 150 g/l |
| Copper sulfate | 20 g/l |
| HCHO | 30 ml/l |
| NaOH | 40 g/l |
| α,α'-bipyridyl | 80 mg/l |
| PEG | 0.1 g/l |

[Electroless plating condition]
A a liquid temperature of 70° C. for 30 minutes (7) A commercially available photosensitive dry film is adhered to the electroless copper plated film 12, and a mask is placed onto the dry film, exposed to a light at 100 mJ/cm² and developed with a 0.8% sodium carbonate solution to form a plating resist 15 having a thickness of 15 µm (see FIG. 10).

(8) The substrate is then subjected to an electrolytic copper plating under the below condition to form an electrolytic copper plated film 13 having a thickness of 15 µm(see FIG. 11).

| [Electrolytic plating solution] | |
|---|---|
| sulfuric acid | 180 g/l |
| copper sulfate | 80 g/l |
| additive (made by Atoteck Japan, trade name: Capalacid GL) | 1 ml/l |

| [Electrolytic plating condition] | |
|---|---|
| current density | 1.0 A/dm² |
| time | 30 minutes |
| temperature | Room temperature |

Figure 12:
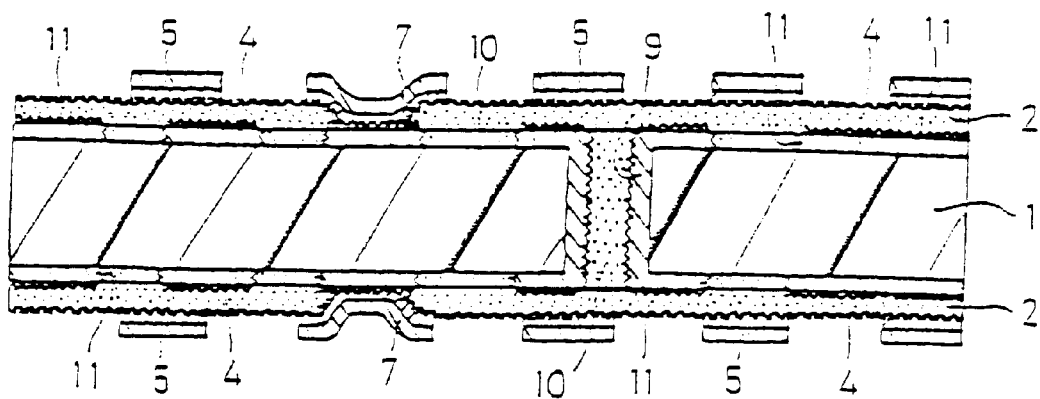

(9) After the plating resist is peeled off by spraying a 5% KOH solution, the electroless plated film 12 located beneath the plating resist 13 is dissolved and removed by etching with a mixed solution of sulfuric acid and hydrogen peroxide to form conductor circuits (inclusive of viaholes) each consisting of the electroless copper plated film 12 and the electrolytic copper plated film 13 and having a thickness of 18 µm(see FIG. 12).

(10) The substrate provided with the conductor circuit is immersed in an electroless plating solution of pH=9 containing 8 g/l of copper sulfate, 0.6 g/l of nickel sulfate, 15 g/l of citric acid, 29 g/l of sodium hypophosphite, 31 g/l of boric acid and 0.1 g/l of surfactant to form a roughened layer 11 of copper-nickel-phohsphorus having a thickness of 3 µm on the surface of the conductor circuit(see FIG. 13). In this case, the roughened layer 11 has a composition ratio of Cu: 98 mol %, Ni: 1.5% and P: 0.5 mol % as analyzed by EPMA (fluorescent X-ray analyzing device).

Further, the substrate is subject to Cu—Sn substitution plating under the condition of the plating bath containing 0.1 mol/l of tin borofluoride and 1.0 mol/l of thiourea, the temperature being 50° C. and pH being 1.2 to form a tin substitution plated layer of 0.3 µm on the surface of the roughened layer 11 (see FIG. 13 provided that tin substituted layer is not shown).

(11) Further, conductor circuits are formed by repeating the steps (2)–(10) to form a multilayer printed circuit board. In this case, the tin substitution plated layer is not formed on the surface of the roughened layer (see FIGS. 14–19).

(12) Furthermore, a solder resist layer and a solder bump are formed according to the steps (16)–(20) of Example 1 to produce a printed circuit board having solder bumps(see FIG. 20).

The roughened surfaces of the conductor circuit and interlaminar insulating resin layer formed according to Example 3 are subjected to measurement of the count value of irregularity level by means of Atomic force microscope (AFM by Olympus Optical Co., Ltd; trade name: NV3000). In these measurements, the count value is obtained within a scanning range of 50 µm, however, Tables 1 and 2 show fifty times multiplication of the actual count value, i.e. the count value of irregularity level at the surface length of 2.5 mm is shown in Tables 1 and 2.

Figure 2:
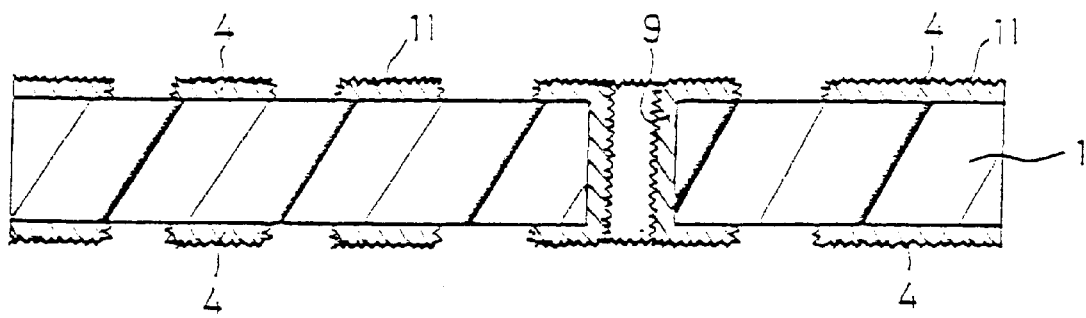

As shown in FIGS. 1 and 2, in the printed circuit board using the adhesive for electroless plating according to the present invention, the count value of irregularity level at the surface length of 2.5 mm with respect to the roughened surface of the adhesive layer is comparatively small, i.e.

50–1300 for the peak count $0.01 \leq Pc \leq 1.0$ μm, and 200–500 for the peak count $0.1 \leq Pc \leq 1.0$ μm, respectively, and residues in the plating resist, electroless plating and Pd catalyst are not found.

Further, the count value with respect to the roughened surface formed on the surface of the conductor circuit is also comparatively small, i.e. 350–650 for the peak count $0.01 \leq Pc \leq 0.1$ μm, and 600–1150 for the peak count $0.1 \leq Pc \leq 1.0$ μm, at the surface length of 2.5 mm, respectively, thereby causing less delay in signal propagation in the conductor circuit.

TABLE 1

Conductor circuit

| Cut Off | $0 \leq Pc \leq 0.01$ (μm) | $0.01 \leq Pc \leq 0.1$ (μm) | $0.1 \leq Pc \leq 1.0$ (μm) |
|---|---|---|---|
| 1 | 0 | 350 | 600 |
| 1/5 | 0 | 500 | 700 |
| 1/20 | 150 | 650 | 1150 |

TABLE 2

Interlaminar Insulating resin layer

| Cut Off | $0 \leq Pc \leq 0.01$ (μm) | $0.01 \leq Pc \leq 0.1$ (μm) | $0.1 \leq Pc \leq 1.0$ (μm) |
|---|---|---|---|
| 1 | 0 | 350 | 600 |
| 1/5 | 0 | 50 | 500 |
| 1/20 | 450 | 1300 | 200 |

COMPARATIVE EXAMPLE 9

The printed circuit board having solder bumps is produced in the same manner as in Example 1 except that the thickness of the interlaminar insulating resin layer is formed to be 35 μm, however, breakage of the interlaminar insulation was found in the roughening treatment.

The tests and evaluations as mentioned below are carried out with respect to the printed circuit boards of the examples and comparative examples.

①. The peel strength is measured according to JIS-C-6481 in the circuit boards of Examples 1, 2 and Comparative Examples 1–8.

②. In the circuit boards of Examples 1, 2 and Comparative Examples 1–8, the depth of depression of the roughened surface is measured by cross-cutting the circuit board and observing the cut section by means of a metal microscope.

③. The surface resistivity is measured with respect to the circuit boards of Example 1 and Comparative Examples 1–3 and 7.

④. In the circuit boards of Example 2 and Comparative Examples 4–6 and 8, the surface resistivity is measured after the circuit board is left to stand under conditions of humidity of 85%, temperature of 130° C. and voltage of 3.3 V for 48 hours.

⑤. The presence or absence of cracks is measured by heat cycle test of −55° C.~125° C. at 500 times with respect to the circuit boards of Examples 1, 2 and Comparative Examples 1–8.

⑥. The L/S forming limit is measured with respect to the circuit boards of Examples 1, 2 and Comparative Examples 1–8.

⑦. The heating test is carried out with respect to the circuit boards of Examples 1, 2 and Comparative Examples 1–8.

The test is carried out under the conditions of 128° C. and 48 hours. According to this heating test, if the resin remains in the opening portion for the formation of viahole, peeling of the viahole is caused. The presence or absence of such a peeling is measured by the conduction resistance of the viahole, whereby peeling of the viahole is confirmed to be caused when the conduction resistance is raised.

⑧. In the circuit boards of Examples 1, 2 and Comparative Examples 1–8, the ratio of generating interlaminar insulation breakage is measured by preparing 100 circuit boards.

The test results are shown in Table 3.

TABLE 3

| | Particle size of heat-resistance resin particle (μm) | Peel strength (kg/cm) | Depression depth of roughened surface (μm) | Surface resistivity | Surface resistivity after being left to stand under high-temperature and high-humidity conditions (Ω) | Cracks | L/S limit (μm) | Peeling of viahole | Ratio of insulation breakage generated (%) |
|---|---|---|---|---|---|---|---|---|---|
| Example | | | | | | | | | |
| 1 | mixture 1.0/0.5 | 1.0 | 3 | $2 \times 10^{14}$ | not measured | absence | 20/20 | absence | 0 |
| 2 | mixture 1.0/0.5 | 1.0 | 3 | not measured | $3 \times 10^{12}$ | presence (2) | 20/20 | absence | 0 |
| Comparative Example | | | | | | | | | |
| 1 | mixture 3.9/0.5 | 1.9 | 10 | $4 \times 10^{8}$ | not measured | absence | 40/40 | absence | 10 |
| 2 | ground particle 1.6 | 1.4 | 4 | $8 \times 10^{13}$ | not measured | presence (1) | 20/20 | presence | 0 |
| 3 | spherical particle 1.6 | 1.0 | 4 | $1 \times 10^{14}$ | not measured | absence | 20/20 | presence | 0 |
| 4 | mixture 3.9/0.5 | 2.0 | 10 | not measured | $5 \times 10^{10}$ | presence (2) | 40/40 | absence | 10 |
| 5 | ground particle 1.6 | 1.4 | 4 | not measured | $7 \times 10^{11}$ | presence (1) (2) | 20/20 | presence | 0 |
| 6 | spherical particle 1.6 | 1.0 | 4 | not measured | $2 \times 10^{12}$ | presence (2) | 20/20 | presence | 0 |

TABLE 3-continued

| | Particle size of heat-resistance resin particle (μm) | Peel strength (kg/cm) | Depression depth of roughened surface (μm) | Surface resistivity | Surface resistivity after being left to stand under high-temperature and high-humidity conditions (Ω) | Cracks | L/S limit (μm) | Peeling of viahole | Ratio of insulation breakage generated (%) |
|---|---|---|---|---|---|---|---|---|---|
| 7 | mixture 5.5/0.5 | 2.6 | 11 | $2 \times 10^8$ | not measured | absence | 45/45 | absence | 15 |
| 8 | mixture 5.5/0.5 | 2.7 | 11 | not measured | $2 \times 10^{10}$ | presence (2) | 45/45 | absence | 15 |

(1) crack starting from anchor of conductor circuit
(2) crack starting from boundary between plating resist and conductor circuit ①. As seen from the results of the above table, when using the adhesive for electroless plating according to the invention, the depth of depression in the roughened surface is shallower (3 μm) as compared with the conventional one and hence a practical peel strength of 1.0 kg/cm can be attained. In the printed circuit board according to the invention, therefore, it is possible to make L/S of the pattern smaller.

②. The rough and fine particles composing the heat-resistant resin particles used in the adhesive for electroless plating according to the invention are less than 2.0 μm in the average particle size, so that gaps between the layers are not caused by the roughening treatment and there is no interlaminar insulation breakage through conduction between the upper layer and the lower layer.

③. When the opening for the formation of viahole is formed in the interlaminar insulating resin layer of the substrate having the roughened surface of the conductor circuit at the underlayer side, the resin remains in the roughened surface. In this connection, when Example 1 is compared with Comparative Examples 2 and 3, since fine particles of not more than 1 μm are existent, it is possible to remove the resin residue in the roughening treatment, so that it is guessed that the peeling of viahole is not caused even in the heating test.

④. The surface resistivity in the circuit board of Example 1 is higher than those of Comparative Examples 1, 7. It is considered that in the circuit board of Comparative Example 1, the electroless plated film cannot be dissolved and removed but retained because the depression of the roughened surface is too deep.

⑤. In the circuit board of Example 2, the surface resistivity does not lower even under high temperature and high humidity conditions. On the contrary, when the circuit boards of Comparative Examples 4, 8 are exposed to high temperature and high humidity conditions, the surface resistivity lowers. It is presumed that in the circuit boards of Comparative Examples 4, 8, the depression of roughened surface is deeper than that in Example 2, so that a greater amount of Pd catalyst nucleus is attached and results in the lowering of the surface resistivity.

⑥. In the circuit boards of Example 1 and Comparative Examples 1, and 7, there is caused no crack by the heat cycle. On the contrary, the circuit boards of Example 2 and Comparative Examples 4, 5, 6, 8 cause the cracks in the interlaminar insulating resin layer (adhesive layer for electroless plating) starting from the boundary between the plating resist and the conductor circuit.

⑦. In the circuit boards of Comparative Examples 2, and 5, cracks starting from the anchor depression beneath the conductor circuit are caused in the adhesive layer for electroless plating. This is believed due to the fact that since the ground powder is sharp in the corner, the resulting anchor depression is also sharp and stress concentration is caused therein in the heat cycle to cause cracks. That is, when ground powder is used, the peel strength is improved, but the cracks are caused in the heat cycle.

⑧. In the adhesive for electroless plating of Example 1, gelation occurred a month after mixing the compositions, and the adhesive has become too high in viscosity to be coated on the substrate, while in the adhesive for electroless plating of Example 3, lowering of the coating property was not found.

Moreover, the example of JP-A-61-276875 uses epoxy modified polyimide resin as a resin matrix, so that the toughness value is higher than that of epoxy-PES resin and the peel strength of 1.6 kg/cm is obtained.

As mentioned above, in the adhesive for electroless plating according to the invention, the practical peel strength can be ensured, and the surface resistivity is high and also the fine pattern of L/S=20/20 μm can be formed, so that there can be provided a printed circuit board having no interlaminar insulation breakage through the roughening treatment.

Further, according to the present invention of the adhesive for electroless plating, the adhesive resin remaining in the bottom of the opening for the viahole can be removed in the roughening treatment, so that the printed circuit board using such an adhesive does not cause the peeling of viahole in the heating test.

What is claimed is:

1. An adhesive for electroless plating formed by dispersing cured heat-resistant resin particles soluble in acid or oxidizing agent into uncured heat-resistant resin matrix hardly soluble in acid or oxidizing agent through curing treatment, wherein the heat-resistant resin particles have an average size of less than 2 μm and are comprised of rough particles and fine particles in a ratio of 10:10 to 35:10 by weight.

2. The adhesive of claim 1, wherein the rough particles have an average size of more than 0.8 μm but less than 2 μm and the fine particles have an average size of 0.1–0.8 μm.

3. The adhesive of claim 1, wherein the resin particles comprise 10–40% rough particles and 1–15% fine particles by weight to a solid content of the adhesive.

4. The adhesive of claim 1, wherein the resin particles are predominantly spherical.

5. The adhesive of claim 1, wherein the resin matrix comprises a composite of a thermosetting resin and a thermoplastic resin.

6. The adhesive of claim 1, wherein the resin matrix comprises a composite of a thermosetting resin and a thermoplastic resin and the thermoplastic resin is present in an amount of 1–30% by weight to a solid content in the resin matrix.

7. The adhesive of claim 1, wherein the resin particles are present in an amount of 5–50% by weight to a solid content in the adhesive.

8. The adhesive of claim 1, wherein the resin matrix comprises a thermoplastic resin and the rough particles are present in an amount of 40–80 parts and the fine particles are present in an amount of 10–40 parts by weight to 100 parts by weight of the thermoplastic resin.

9. A printed circuit board comprising a substrate, a cured adhesive layer for electroless plating having a roughened surface, and a conductor circuit formed on the roughened surface, wherein the adhesive layer comprises the adhesive of claim 1.

10. The printed circuit board of claim 9, wherein the rough particles of the adhesive have an average size of more than 0.8 µm but less than 2 µm and the fine particles have an average size of 0.1–0.8 µm.

11. The printed circuit board of claim 9, wherein the depth of the roughened surface is 1–5 µm.

12. The printed circuit board of claim 11, wherein the roughened surface has a peak count value (Pc) of roughness for a surface length of 2.5 mm of 10–2500 where $0.01 \leq Pc \leq 0.1$ µm and 100–1000 where $0.1 \leq Pc \leq 1.0$ µm.

13. The printed circuit board of claim 9, wherein the adhesive layer has a thickness of less than 50 µm.

14. The printed circuit board of claim 9, wherein the circuit board has a fine pattern line:space ratio of less than 40:40 µm.

15. The printed circuit board of claim 9, wherein the conductor circuit comprises an electroless plated film and an electrolytic plated film.

16. The printed circuit board of claim 9, wherein a roughened layer is formed on at least part of the surface of the conductor circuit.

17. The printed circuit board of claim 9, wherein the printed circuit board has a peel strength of 1.0–1.3 kg/cm.

18. An adhesive for electroless plating formed by dispersing cured heat-resistant resin particles soluble in acid or oxidizing agent into uncured heat-resistant resin matrix hardly soluble in acid or oxidizing agent through curing treatment, wherein the heat-resistant resin particles have an average size of less than 2 µm and are comprised of rough particles and fine particles, the rough particles comprising 10–40% and the fine particles comprising 1–15% by weight to a solid content of the adhesive.

19. The adhesive of claim 18, wherein the rough particles have an average size of more than 0.8 µm but less than 2 µm and the fine particles have an average size of 0.1–0.8 µm.

20. The adhesive of claim 18, wherein the resin particles are predominantly spherical.

21. The adhesive of claim 18, wherein the resin matrix comprises a composite of a thermosetting resin and a thermoplastic resin.

22. The adhesive of claim 18, wherein the resin matrix comprises a composite of a thermosetting resin and a thermoplastic resin and the thermoplastic resin is present in an amount of 1–30% by weight to a solid content in the resin matrix.

23. The adhesive of claim 18, wherein the resin particles are present in an amount of 5–50% by weight to a solid content in the adhesive.

24. The adhesive of claim 18, wherein the resin matrix comprises a thermoplastic resin and the rough particles are present in an amount of 40–80 parts and the fine particles are present in an amount of 10–40 parts by weight to 100 parts by weight of the thermoplastic resin.

25. A printed circuit board comprising a substrate, a cured adhesive layer for electroless plating having a roughened surface, and a conductor circuit formed on the roughened surface, wherein the adhesive layer comprises the adhesive of claim 18.

26. The printed circuit board of claim 25, wherein the rough particles of the adhesive have an average size of more than 0.8 µm but less than 2 µm and the fine particles have an average size of 0.1–0.8 µm.

27. The printed circuit board of claim 25, wherein the depth of the roughened surface is 1–5 µm.

28. The printed circuit board of claim 27, wherein the roughened surface has a peak count value (Pc) of roughness for a surface length of 2.5 mm of 10–2500 where $0.01 \leq Pc \leq 0.1$ µm and 100–1000 where $0.1 \leq Pc \leq 1.0$ µm.

29. The printed circuit board of claim 25, wherein the adhesive layer has a thickness of less than 50 µm.

30. The printed circuit board of claim 25, wherein the circuit board has a fine pattern line:space ratio of less than 40:40 µm.

31. The printed circuit board of claim 25, wherein the conductor circuit comprises an electroless plated film and an electrolytic plated film.

32. The printed circuit board of claim 25, wherein a roughened layer is formed on at least part of the surface of the conductor circuit.

33. The printed circuit board of claim 25, wherein the printed circuit board has a peel strength of 1.0–1.3 kg/cm.

34. A material composition for the preparation an adhesive for electroless plating comprising the following groups 1–3 prepared and preserved in a separated manner to one another in advance of mixing:

group 1: a resin composition comprising an uncured thermosetting resin which becomes hardly soluble in acid or oxidizing agent through curing treatment;

group 2: a resin composition comprising cured heat-resistant resin particles soluble in acid or oxidizing agent, a thermoplastic resin, and an organic solvent; and group 3: a curing agent composition;

wherein a mixing proportion of the resin particles of group 2 is 5–50% by weight to a solid content in the prepared adhesive.

35. The material composition of claim 34, wherein the resin particles of group 2 comprise rough particles and fine particles and the rough particles have an average size of more than 0.8 µm but less than 2 µm and the fine particles have an average size of 0.1–0.8 µm.

36. A material composition for the preparation an adhesive for electroless plating comprising the following groups 1–3 prepared and preserved in a separated manner to one another in advance of mixing:

group 1: a resin composition comprising an uncured thermosetting resin which becomes hardly soluble in acid or oxidizing agent through curing treatment;

group 2: a resin composition comprising cured heat-resistant resin particles soluble in acid or oxidizing agent, a thermoplastic resin, and an organic solvent; and group 3: a curing agent composition;

wherein the resin particles in group 2 have an average particle size of less than 2 µm and comprise 40–80 parts by weight rough particles and 10–40 parts by weight fine particles to 100 parts by weight of the thermoplastic resin of group 2.

37. The material composition of claim 36, wherein the rough particles have an average size of more than 0.8 µm but less than 2 µm and the fine particles have an average size of 0.1–0.8 µm.

38. A material composition for the preparation an adhesive for electroless plating comprising the following groups 1–3 prepared and preserved in a separated manner to one another in advance of mixing:
- group 1: a resin composition comprising an uncured thermosetting resin which becomes hardly soluble in acid or oxidizing agent through curing treatment;
- group 2: a resin composition comprising cured heat-resistant resin particles soluble in acid or oxidizing agent, a thermoplastic resin, and an organic solvent; and
- group 3: a curing agent composition;

wherein a mixing proportion of the thermosetting resin in group 1 to the thermoplastic resin in group 2 is 1:4 to 4:1 by weight.

39. The material composition of claim 38, wherein the resin particles of group 2 comprise rough particles and fine particles and the rough particles have an average size of more than 0.8 $\mu$m but less than 2 $\mu$m and the fine particles have an average size of 0.1–0.8 $\mu$m.

* * * * *